US011429348B2

(12) United States Patent
Shibata et al.

(10) Patent No.: US 11,429,348 B2
(45) Date of Patent: Aug. 30, 2022

(54) MULTIPLY AND ACCUMULATE CALCULATION DEVICE, NEUROMORPHIC DEVICE, AND METHOD FOR USING MULTIPLY AND ACCUMULATE CALCULATION DEVICE

(71) Applicant: TDK CORPORATION, Tokyo (JP)

(72) Inventors: Tatsuo Shibata, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 304 days.

(21) Appl. No.: 16/759,529

(22) PCT Filed: Feb. 27, 2019

(86) PCT No.: PCT/JP2019/007557
§ 371 (c)(1),
(2) Date: Apr. 27, 2020

(87) PCT Pub. No.: WO2019/176540
PCT Pub. Date: Sep. 19, 2019

(65) Prior Publication Data
US 2020/0334015 A1 Oct. 22, 2020

(30) Foreign Application Priority Data
Mar. 16, 2018 (JP) .............................. JP2018-049766

(51) Int. Cl.
*G06F 7/544* (2006.01)
*G06F 7/02* (2006.01)
(Continued)

(52) U.S. Cl.
CPC .............. *G06F 7/5443* (2013.01); *G06F 7/02* (2013.01); *G06F 7/383* (2013.01); *G06F 7/50* (2013.01); *G06F 7/523* (2013.01); *G06N 3/063* (2013.01)

(58) Field of Classification Search
CPC .......... G06F 7/5443; G06F 7/02; G06F 7/383; G06F 7/50; G06F 7/523
See application file for complete search history.

(56) References Cited

U.S. PATENT DOCUMENTS

2010/0008131 A1* 1/2010 Fukami ................... H01L 43/08
365/158
2018/0350432 A1 12/2018 Sasaki
2019/0171418 A1 6/2019 Morie et al.

FOREIGN PATENT DOCUMENTS

| JP | 5160304 B2 | 3/2013 |
| WO | 2017/183573 A1 | 10/2017 |
| WO | 2018/034163 A1 | 2/2018 |

OTHER PUBLICATIONS

Burr, Geoffrey W. et al., "Neuromorphic Computing Using Non-Volatile Memory", Advances in Physics: X, (2017), vol. 2, No. 1, pp. 89-124.
(Continued)

*Primary Examiner* — Michael D. Yaary
(74) *Attorney, Agent, or Firm* — Oliff PLC

(57) ABSTRACT

A multiply and accumulate calculation device includes a multiple calculation unit and a accumulate calculation unit. The multiple calculation unit includes a plurality of multiple calculation elements, which are variable resistance elements, and at least one reference element. The accumulate calculation unit includes an output detector configured to detect a total value of at least outputs from the plurality of multiple calculation elements. Each of the plurality of multiple calculation elements is a magnetoresistance effect element including a magnetized free layer having a magnetic domain wall, a magnetization fixed layer in which a magnetization direction is fixed, and a nonmagnetic layer sandwiched between the magnetized free layer and the magnetized fixed layer. The reference element is a reference (Continued)

magnetoresistance effect element having a magnetization free layer that does not have the magnetic domain wall.

20 Claims, 6 Drawing Sheets

(51) Int. Cl.
*G06F 7/38* (2006.01)
*G06F 7/50* (2006.01)
*G06F 7/523* (2006.01)
*G06N 3/063* (2006.01)

(56) References Cited

OTHER PUBLICATIONS

Narayanan, P. et al., "Toward On-Chip Acceleration of the Backpropagation Algorithm Using Nonvolatile Memory", IBM J. Res. & Dev., vol. 61, No. 4/5, pp. 11:1-11:11, (2017).
Chen, Zhe et al., "Optimized Learning Scheme for Grayscale Image Recognition in a RRAM Based Analog Neuromorphic System", (2015), IEEE, pp. 17.7.1-17.7.4.
May 21, 2019 Search Report issued in International Patent Application No. PCT/JP2019/007557.

* cited by examiner

MULTIPLY AND ACCUMULATE CALCULATION DEVICE, NEUROMORPHIC DEVICE, AND METHOD FOR USING MULTIPLY AND ACCUMULATE CALCULATION DEVICE

TECHNICAL FIELD

The present invention relates to a multiply and accumulate calculation device, a neuromorphic device, and a method of using the multiply and accumulate calculation device.

Priority is claimed on Japanese Patent Application No. 2018-049766, filed Mar. 16, 2018, the content of which is incorporated herein by reference.

BACKGROUND ART

Conventionally, an optimized learning scheme for grayscale image recognition in an RRAM (registered trademark)-based analog neuromorphic system is known (see, for example, Non-Patent Document 1). As described in this literature, the analog neuromorphic system is developed on the basis of an assembled resistive switching memory array. In the literature, a new training scheme is proposed to optimize the performance of the analog system using segmented synaptic behavior. Also in the literature, the scheme is applied to grayscale image recognition.

Also, research for implementing a neural network imitating a nervous system using an array of variable resistance elements is being conducted. A neuromorphic device (NMD) performs multiply and accumulate calculation for performing multiple calculations with weights to the previous stage and the next stage and performing accumulate calculation on results of multiple calculations. Therefore, various types of multiply and accumulate calculation devices in which a plurality of variable resistance elements in which the resistance continuously changes are combined, multiple calculation is performed on input signals using respective resistance values as weights, and accumulate calculation is performed by accumulating electric currents output therefrom and an NMD using the same are being developed.

For example, Patent Document 1 describes a magnetic neuron system using a magnetic domain wall-based variable magnetoresistance element using the fact that a resistance value changes continuously in accordance with a position of a magnetic domain wall within a magnetic recording layer.

CITATION LIST

Patent Literature

[Patent Document 1]
  PCT International Publication No. WO2017/183573

Non-Patent Literature

[Non-Patent Document 1]
  Zhe Chen et al., "Optimized Learning Scheme for Grayscale Image Recognition in a RRAM-Based Analog Neuromorphic System", 2015, IEEE, p. 17.7.1-p. 17.7.4

DISCLOSURE OF INVENTION

Technical Problem

Incidentally, in Patent Document 1, a change in characteristics depending upon the temperature of a magnetoresistance effect element constituting the system is not taken into account. Thus, the performance of the neural network is likely to deteriorate when the temperature changes. Also, in particular, because the magnetoresistance value of the element may differ according to an electric current direction when a tunnel magnetoresistance effect element is used as the magnetoresistance effect element, an operation which is more complex than those of other variable resistance elements is required when back-propagation learning is performed and therefore a processing speed is likely to be reduced.

In view of the above-described problems, an objective of the present invention is to provide a multiply and accumulate calculation device, a neuromorphic device, and a method of using the multiply and accumulate calculation device capable of minimizing deterioration in performance of a neural network due to changes in temperature and element characteristics originating from an electric current direction when the present invention is applied to the neural network.

Solution to Problem

According to an aspect of the present invention, there is provided a multiply and accumulate calculation device including: a multiple calculation unit; and an accumulate calculation unit, wherein the multiple calculation unit includes a plurality of multiple calculation elements and at least one reference element, each of the plurality of multiple calculation elements and the at least one reference element is a variable resistance element, the accumulate calculation unit includes an output detector configured to detect a total value of at least outputs from the plurality of multiple calculation elements, each of the plurality of multiple calculation elements is a magnetoresistance effect element including: a first magnetization free layer having a magnetic domain wall; a first magnetization fixed layer in which a magnetization direction is fixed; and a first nonmagnetic layer sandwiched between the first magnetization free layer and the first magnetization fixed layer, and the at least one reference element is a reference magnetoresistance effect element including: a second magnetization free layer that does not have the magnetic domain wall or a third magnetization free layer having the magnetic domain wall; a second magnetization fixed layer in which the magnetization direction is fixed; and a second nonmagnetic layer sandwiched between the second magnetization free layer or the third magnetization free layer and the second magnetization fixed layer, wherein a relative angle formed by each of one magnetization direction of the second magnetization free layer or a plurality of magnetization directions of the third magnetization free layer and the magnetization direction of the second magnetization fixed layer is fixed.

In the multiply and accumulate calculation device according to the aspect of the present invention, the at least one reference element may include: a first reference element in which the one magnetization direction of the second magnetization free layer and the magnetization direction of the second magnetization fixed layer are antiparallel or a third reference element having the third magnetization free layer in which a maximum resistance value is set; and a second reference element with the magnetization fixed layer in which the one magnetization direction of the second magnetization free layer and the magnetization direction of the second magnetization fixed layer are parallel or a fourth reference element having the third magnetization free layer in which a minimum resistance value is set.

The multiply and accumulate calculation device according to the aspect of the present invention may further include a comparison unit configured to compare the outputs from the plurality of multiple calculation elements with an output from the at least one reference element.

The multiply and accumulate calculation device according to the aspect of the present invention may further include at least one reference column, wherein the at least one reference column may include the at least one reference element without including the plurality of multiple calculation elements.

The multiply and accumulate calculation device according to the aspect of the present invention may further include at least one reference output detector, wherein each of the at least one reference output detector may detect an output of each of the at least one reference column.

According to an aspect of the present invention, there is provided a method of using the multiply and accumulate calculation device, wherein the multiply and accumulate calculation device further includes a failure detection unit, and the method may include: a normal range setting process in which the failure detection unit is configured to set a normal range of the total value of the outputs from the plurality of multiple calculation elements detected by the output detector on the basis of the output of each of the at least one reference column detected by the at least one reference output detector; and a failure presence or absence determination process in which the failure detection unit is configured to determine the presence or absence of a failure of the plurality of multiple calculation elements on the basis of the total value of the outputs from the plurality of multiple calculation elements detected by the output detector and the normal range.

In the method of using the multiply and accumulate calculation device according to the aspect of the present invention, the multiply and accumulate calculation device may further include a comparison unit and the method may further include a comparison process in which the comparison unit is configured to compare the total value of the outputs from the plurality of multiple calculation elements detected by the output detector with the output of each of the at least one reference column detected by the at least one reference output detector.

In the method of using the multiply and accumulate calculation device according to the aspect of the present invention, the multiply and accumulate calculation device may further include a correction unit and the method may further include a correction process in which the correction unit is configured to calculate an amount of change in a resistance value depending upon temperatures of the plurality of multiple calculation elements on the basis of the total value of the outputs from the plurality of multiple calculation elements detected by the output detector and the output of each of the at least one reference column detected by the at least one reference output detector and correct resistance values of the plurality of multiple calculation elements.

In the method of using the multiply and accumulate calculation device according to the aspect of the present invention, the at least one reference column may include an operation reference column and a back-propagation reference column.

According to an aspect of the present invention, there is provided a neuromorphic device including the multiply and accumulate calculation device.

Advantageous Effects of Invention

According to the present invention, it is possible to provide a multiply and accumulate calculation device, a neuromorphic device, and a method of using the multiply and accumulate calculation device capable of minimizing deterioration in performance of a neural network due to changes in temperature and element characteristics originating from an electric current direction when the present invention is applied to the neural network.

BEST MODE FOR CARRYING OUT THE INVENTION

Hereinafter, embodiments of a multiply and accumulate calculation device, a neuromorphic device, and a method of using the multiply and accumulate calculation device of the present invention will be described with reference to the drawings.

First Embodiment

Figure 1:
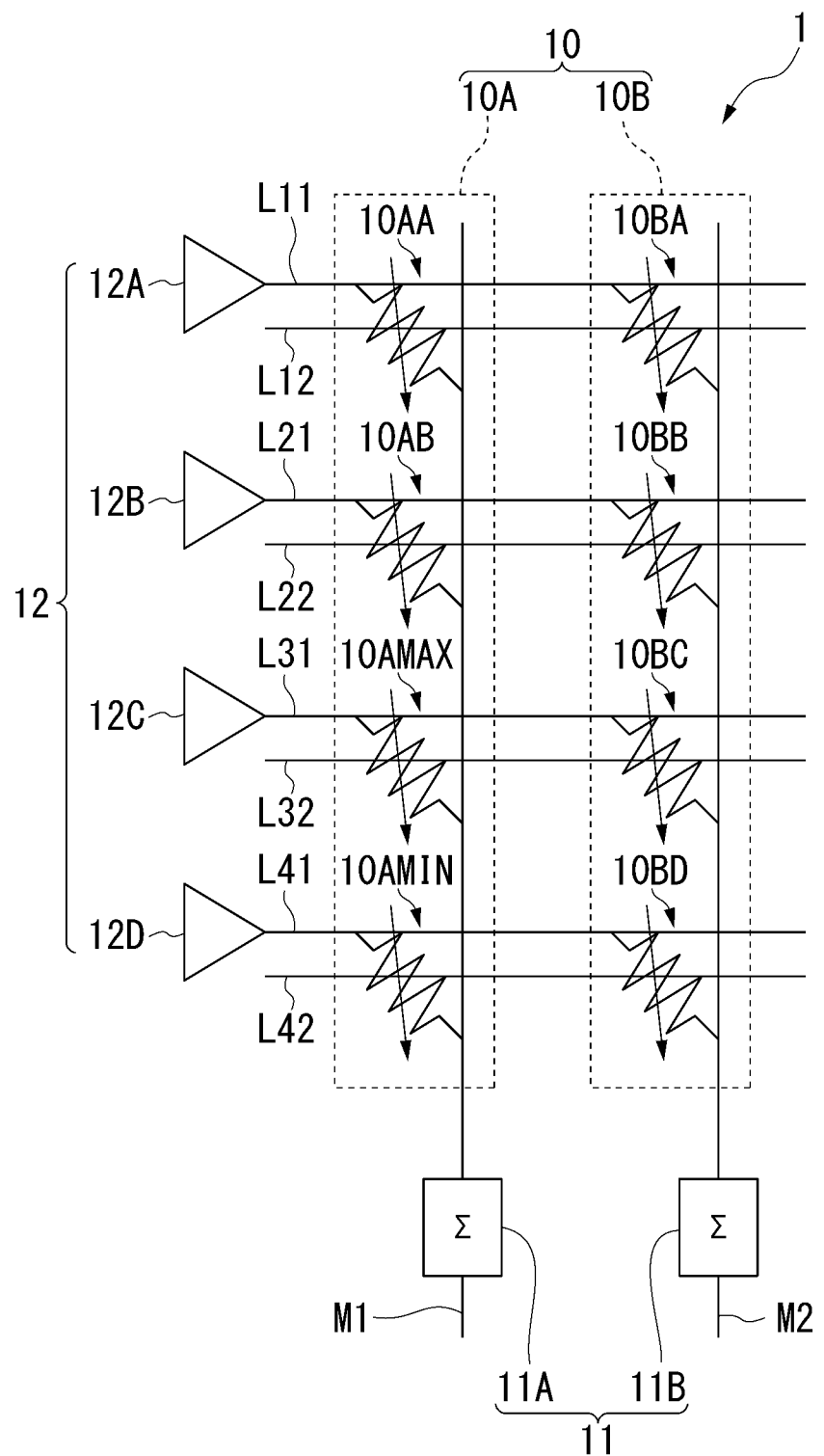
FIG. 1 is a diagram showing an example of a partial configuration of a multiply and accumulate calculation device according to a first embodiment.
Figure 2:
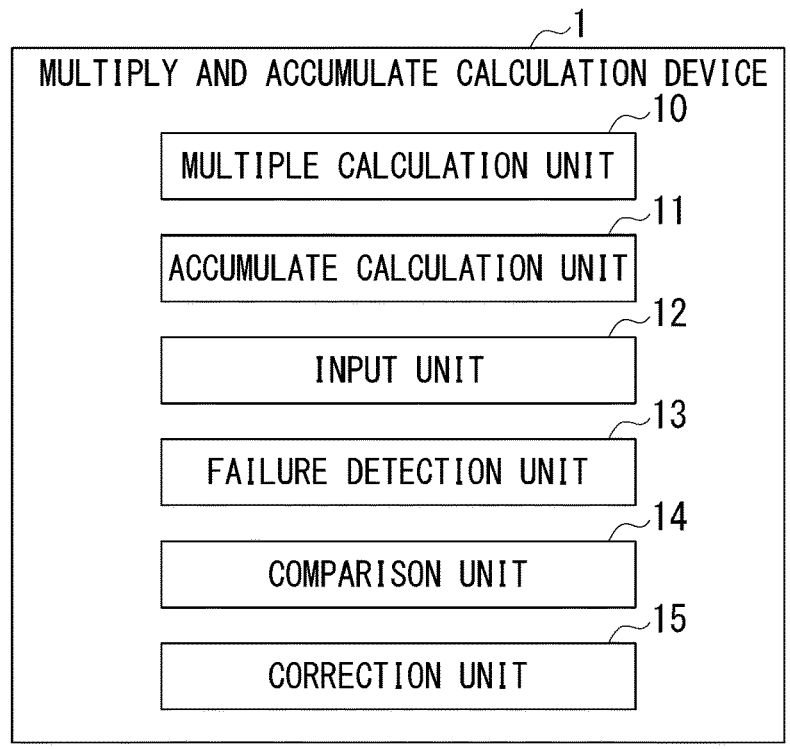
FIG. 2 is a diagram showing an example of an overall configuration of the multiply and accumulate calculation device according to the first embodiment.

FIG. 1 is a diagram showing an example of a partial configuration of the multiply and accumulate calculation device 1 according to the first embodiment. FIG. 2 is a diagram showing an example of an overall configuration of the multiply and accumulate calculation device 1 according to the first embodiment.

In the example shown in FIGS. 1 and 2, the multiply and accumulate calculation device 1 of the first embodiment includes a multiple calculation unit 10, an accumulate calculation unit 11, an input unit 12, a failure detection unit 13, a comparison unit 14, and a correction unit 15. The multiple calculation unit 10 includes a column 10A and a column 10B.

In the example shown in FIG. 1, the multiple calculation unit 10 includes the two columns 10A and 10B. However, in another example, the multiple calculation unit 10 may include any number of columns 10A, 10B, and the like which is greater than or equal to three.

In the example shown in FIG. 1, the column 10A includes a multiple calculation element 10AA, a multiple calculation element 10AB, a reference element 10AMAX, and a reference element 10AMIN. The multiple calculation elements 10AA and 10AB perform multiple calculation. The reference element 10AMAX is used to correct a maximum resistance value of the multiple calculation elements 10AA and 10AB and the like at the time of an operation or back-propagation learning of the multiply and accumulate calculation device 1. The reference element 10AMIN is used to correct a minimum resistance value of the multiple calculation elements 10AA and 10AB and the like at the time of the operation or the back-propagation learning of the multiply and accumulate calculation device 1.

The column 10B includes a multiple calculation element 10BA, a multiple calculation element 10BB, a multiple calculation element 10BC, and a multiple calculation element 10BD. Similar to the multiple calculation elements 10AA and 10AB, the multiple calculation elements 10BA to 10BD perform multiple calculation.

Although the column 10A includes two multiple calculation elements 10AA and 10AB and the column 10B includes four multiple calculation elements 10BA, 10BB, 10BC, and 10BD in the example shown in FIG. 1, the number of multiple calculation elements included in the column 10A may be any number (in detail, two or more) other than two and the number of multiple calculation elements included in the column 10B may be any number (in detail, two or more) other than four in other examples.

In the example shown in FIG. 1, the column 10A includes one reference element 10AMAX that is used to correct a maximum value of resistance values of the multiple calculation elements 10AA, 10AB, and the like at the time of the operation or the back-propagation learning of the multiply and accumulate calculation device 1 and one reference element 10AMIN that is used to correct a minimum value of resistance values of the multiple calculation elements 10AA, 10AB, and the like at the time of the operation or the back-propagation learning of the multiply and accumulate calculation device 1. In another example, the column 10A may include a plurality of reference elements that are used to correct the resistance values of the multiple calculation elements 10AA, 10AB, and the like at the time of the operation of the multiply and accumulate calculation device 1 or include a plurality of reference elements that are used to correct the resistance values of the multiple calculation elements 10AA, 10AB, and the like at the time of the back-propagation learning of the multiply and accumulate calculation device 1.

In the example shown in FIG. 1, the input unit 12 includes a first input unit 12A, a second input unit 12B, a third input unit 12C, and a fourth input unit 12D. Each of the plurality of multiple calculation elements 10AA, 10AB, and 10BA to 10BD and the reference elements 10AMAX and 10AMIN is a variable resistance element including a read terminal, a write terminal, and a common terminal.

The read terminals of the multiple calculation elements 10AA and 10BA are connected to a line L11. The line L11 is connected to the first input unit 12A that inputs a signal to the multiple calculation elements 10AA and 10BA at the time of the operation of the multiply and accumulate calculation device 1. The write terminals of the multiple calculation elements 10AA and 10BA are connected to a line L12.

The read terminals of the multiple calculation elements 10AB and 10BB are connected to a line L21. The line L21 is connected to the second input unit 12B that inputs a signal to the multiple calculation elements 10AB and 10BB at the time of the operation of the multiply and accumulate calculation device 1. The write terminals of the multiple calculation elements 10AB and 10BB are connected to a line L22.

The read terminals of the reference element 10AMAX and the multiple calculation element 10BC are connected to a line L31. The line L31 is connected to the third input unit 12C that inputs a signal to the reference element 10AMAX and the multiple calculation element 10BC at the time of the operation of the multiply and accumulate calculation device 1. The write terminals of the reference element 10AMAX and the multiple calculation element 10BC are connected to a line L32.

The read terminals of the reference element 10AMIN and the multiple calculation element 10BD are connected to a line L41. The line L41 is connected to the fourth input unit 12D that inputs a signal to the reference element 10AMIN and the multiple calculation element 10BD at the time of the operation of the multiply and accumulate calculation device 1. The write terminals of the reference element 10AMIN and the multiple calculation element 10BD are connected to a line LX2.

A common terminal of the multiple calculation elements 10AA and 10AB and the reference elements 10AMAX and 10AMIN are connected to a line M1. The common terminal of the multiple calculation elements 10BA, 10BB, 10BC, and 10BD is connected to a line M2.

It is only necessary for the magnetoresistance effect element used as the multiple calculation element in the present invention to be an element whose resistance is variable using a magnetoresistance effect. Typical examples include a tunnel magnetoresistance effect (TMR) element and a giant magnetoresistance effect (GMR) element.

In the example shown in FIG. 1, the accumulate calculation unit 11 includes an output detector 11A and an output detector 11B. The output detector 11A is disposed on the line M1. The output detector 11B is disposed on the line M2.

When the first input unit 12A inputs a signal to the multiple calculation element 10AA, the second input unit 12B inputs a signal to the multiple calculation element 10AB, the third input unit 12C inputs a signal to the reference element 10AMAX, and the fourth input unit 12D inputs a signal to the reference element 10AMIN, the output detector 11A detects a total value of an output from the multiple calculation element 10AA, an output from the multiple calculation element 10AB, an output from the reference element 10AMAX, and an output from the reference element 10AMIN.

When the first input unit 12A inputs a signal to the multiple calculation element 10AA, the second input unit 12B does not input a signal to the multiple calculation element 10AB, the third input unit 12C does not input a signal to the reference element 10AMAX, and the fourth input unit 12D does not input a signal to the reference element 10AMIN, the output detector 11A detects an output from the multiple calculation element 10AA.

When the first input unit 12A does not input a signal to the multiple calculation element 10AA, the second input unit 12B inputs a signal to the multiple calculation element 10AB, the third input unit 12C does not input a signal to the reference element 10AMAX, and the fourth input unit 12D does not input a signal to the reference element 10AMIN, the output detector 11A detects an output from the multiple calculation element 10AB.

When the first input unit 12A does not input a signal to the multiple calculation element 10AA, the second input unit 12B does not input a signal to the multiple calculation element 10AB, the third input unit 12C inputs a signal to the reference element 10AMAX, and the fourth input unit 12D does not input a signal to the reference element 10AMIN, the output detector 11A detects an output from the reference element 10AMAX.

When the first input unit 12A does not input a signal to the multiple calculation element 10AA, the second input unit 12B does not input a signal to the multiple calculation element 10AB, the third input unit 12C does not input a signal to the reference element 10AMAX, and the fourth input unit 12D inputs a signal to the reference element 10AMIN, the output detector 11A detects an output from the reference element 10AMIN.

When the first input unit 12A inputs a signal to the multiple calculation element 10BA, the second input unit 12B inputs a signal to the multiple calculation element 10BB, the third input unit 12C inputs a signal to the multiple calculation element 10BC, and the fourth input unit 12D inputs a signal to the multiple calculation element 10BD, the output detector 11B detects a total value of an output from the multiple calculation element 10BA, an output from the multiple calculation element 10BB, an output from the multiple calculation element 10BC and an output from the multiple calculation element 10BD.

When the first input unit 12A inputs a signal to the multiple calculation element 10BA, the second input unit 12B does not input a signal to the multiple calculation element 10BB, the third input unit 12C does not input a signal to the multiple calculation element 10BC, and the fourth input unit 12D does not input a signal to the multiple calculation element 10BD, the output detector 11B detects an output from the multiple calculation element 10BA.

When the first input unit 12A does not input a signal to the multiple calculation element 10BA, the second input unit 12B inputs a signal to the multiple calculation element 10BB, the third input unit 12C does not input a signal to the multiple calculation element 10BC, and the fourth input unit 12D does not input a signal to the multiple calculation element 10BD, the output detector 11B detects an output from the multiple calculation element 10BB.

When the first input unit 12A does not input a signal to the multiple calculation element 10BA, the second input unit 12B does not input a signal to the multiple calculation element 10BB, the third input unit 12C inputs a signal to the multiple calculation element 10BC, and the fourth input unit 12D does not input a signal to the multiple calculation element 10BD, the output detector 11B detects an output from the multiple calculation element 10BC.

When the first input unit 12A does not input a signal to the multiple calculation element 10BA, the second input unit 12B does not input a signal to the multiple calculation element 10BB, the third input unit 12C does not input a signal to the multiple calculation element 10BC, and the fourth input unit 12D inputs a signal to the multiple calculation element 10BD, the output detector 11B detects an output from the multiple calculation element 10BD.

In the example shown in FIG. 1, when the first input unit 12A inputs a signal to the multiple calculation element 10AA, the second input unit 12B inputs a signal to the multiple calculation element 10AB, the third input unit 12C inputs a signal to the reference element 10AMAX, and the fourth input unit 12D inputs a signal to the reference element 10AMIN, the output detector 11A detects a total value of an output current from the multiple calculation element 10AA, an output current from the multiple calculation element 10AB, an output current from the reference element 10AMAX, and an output current from the reference element 10AMIN.

In another example, when the first input unit 12A inputs a signal to the multiple calculation element 10AA, the second input unit 12B inputs a signal to the multiple calculation element 10AB, the third input unit 12C inputs a signal to the reference element 10AMAX, and the fourth input unit 12D inputs a signal to the reference element 10AMIN, the output detector 11A may detect a total value of charge corresponding to the output from the multiple calculation element 10AA, charge corresponding to the output from the multiple calculation element 10AB, charge corresponding to the output from the reference element 10AMAX, charge corresponding to the output from the reference element 10AMAX, and charge corresponding to the output from the reference element 10AMIN.

In detail, in the example shown in FIG. 1, each of the multiple calculation elements 10AA, 10AB, and 10BA to 10BD is a magnetoresistance effect element that exhibits a magnetoresistance effect.

Figure 3:
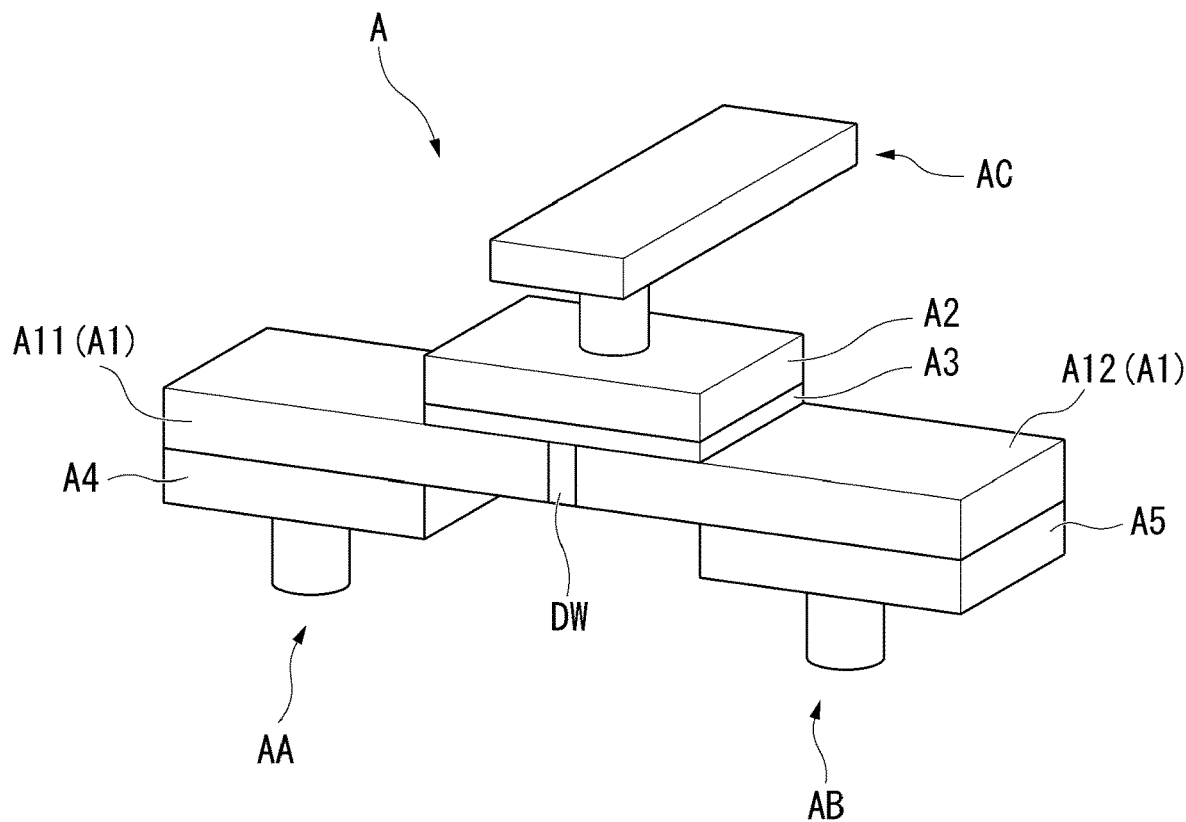
FIG. 3 is a perspective view showing an example of a magnetoresistance effect element constituting each of multiple calculation elements of the multiply and accumulate calculation device according to the first embodiment.

FIG. 3 is a perspective view showing an example of a magnetoresistance effect element A that constitutes each of the multiple calculation elements 10AA, 10AC, and 10BA to 10BD of the multiply and accumulate calculation device 1 according to the first embodiment.

In the example shown in FIG. 3, the magnetoresistance effect element A includes a magnetization free layer A1 having a magnetic domain wall DW, a magnetization fixed layer A2 in which a magnetization direction is fixed, and a nonmagnetic layer A3. The nonmagnetic layer A3 is sandwiched between the magnetization free layer A1 and the magnetization fixed layer A2. The magnetization free layer A1 has a first region A11 on one side of the magnetic domain wall DW and a second region A12 on the other side of the magnetic domain wall DW. A write terminal AA is provided in the first region A11. A common terminal AB is provided in the second region A12. A read terminal AC is provided in the magnetization fixed layer A2.

An amount of movement (a movement distance) of the magnetic domain wall DW can be variably controlled by adjusting a magnitude and time of the write current that flows between the write terminal AA and the common terminal AB. For the magnitude and time of the write current, for example, the amount of movement (the movement distance) of the magnetic domain wall DW can be set according to the number of pulses or a pulse width. When an area of a portion where the magnetization directions of the magnetization fixed layer A2 and the magnetization free layer A1 are parallel (or antiparallel) is continuously changed by driving (moving) the magnetic domain wall DW, the ratio between an area proportion of a portion where the magnetization directions are parallel and an area proportion of a portion where the magnetization directions are antiparallel is continuously changed and a resistance change close to a linear change is obtained in the magnetoresistance effect element.

Also, it is possible to read data by causing an electric current to flow between the read terminal AC and the common terminal AB and detecting resistance corresponding to a ratio between an area proportion of a portion where the magnetization directions are parallel and an area proportion of a portion where the magnetization directions are antiparallel (see, for example, Patent Document 1).

[Magnetization Fixed Layer A2]

The magnetization fixed layer A2 is a layer in which the magnetization is oriented in the first direction (for example, leftward in FIG. 3) and fixed. Here, when the magnetization is fixed, this indicates that the magnetization direction does not change (magnetization is fixed) before and after writing using the write current.

In the example shown in FIG. 3, the magnetization fixed layer A2 is an in-plane magnetization film whose magnetization has in-plane magnetic anisotropy (in-plane easy magnetization axis). The magnetization fixed layer A2 is not limited to the in-plane magnetization film and may be a perpendicular magnetization film having perpendicular magnetic anisotropy (perpendicular easy magnetization axis).

When the magnetization fixed layer A2 is an in-plane magnetization film, the magnetization fixed layer A2 has a high MR ratio (magnetoresistance change ratio) and is not easily affected by spin transfer torque (STT) at the time of reading, and can increase a read voltage. On the other hand, when an element is desired to be miniaturized, it is preferable to use a perpendicular magnetization film having large magnetic anisotropy and a small magnetic domain wall width.

A known material can be used for the magnetization fixed layer A2. For example, a metal selected from the group consisting of Cr, Mn, Co, Fe, and Ni and an alloy that includes one or more of these metals and exhibits ferromagnetism can be used. An alloy containing these metals and at least one element of B, C, and N can also be used. Specific examples include Co—Fe and Co—Fe—B.

Also, a Heusler alloy such as $Co_2FeSi$ can be used for the magnetization fixed layer A2. The Heusler alloy contains an intermetallic compound having a chemical composition of $X_2YZ$, wherein X is a Co, Fe, Ni, or Cu group transition metal element or a noble metal element in the periodic table, Y is a Mn, V, Cr, or Ti group transition metal and can be the elemental species of X, and Z is a typical element from Groups III to V. Examples of the Heusler alloy include $Co_2FeSi$, $Co_2MnSi$, $Co_2Mn_{1-a}Fe_aAl_bSi_{1-b}$, and the like.

Also, the magnetization fixed layer A2 may have a synthetic structure including a ferromagnetic layer and a nonmagnetic layer or a synthetic structure including an antiferromagnetic layer, a ferromagnetic layer, and a nonmagnetic layer. In the latter, the magnetization direction of the magnetization fixed layer A2 is strongly held by the antiferromagnetic layer in the synthetic structure. Thus, the magnetization of the magnetization fixed layer A2 is not easily affected from the outside.

When the magnetization of the magnetization fixed layer A2 is oriented within an XY plane (the magnetization fixed layer A2 is an in-plane magnetization film), it is preferable to use, for example, NiFe. On the other hand, when the magnetization of the magnetization fixed layer A2 is oriented in a Z direction (the magnetization fixed layer A2 is a perpendicular magnetization film), it is preferable to use, for example, a Co/Ni laminated film, a Co/Pt laminated film, or the like. For example, when the magnetization fixed layer A2 has [Co (0.24 nm)/Pt (0.16 nm)]6/Ru (0.9 nm)/[Pt (0.16 nm)/Co (0.16 nm)]4/Ta (0.2 nm)/FeB (1.0 nm), a perpendicular magnetization film is obtained.

[Nonmagnetic Layer A3]

The nonmagnetic layer A3 is provided on a lower surface of the magnetization fixed layer A2. The magnetoresistance effect element A reads a change in a magnetization state of the magnetization free layer A1 with respect to the magnetization fixed layer A2 as a change in a resistance value via the nonmagnetic layer A3. That is, the magnetization fixed layer A2, the nonmagnetic layer A3, and the magnetization free layer A1 function as the magnetoresistance effect element A. When the nonmagnetic layer A3 is made of an insulator, a configuration similar to a tunnel magnetoresistance (TMR) element is provided. When the nonmagnetic layer A3 is made of a metal, a configuration similar to a giant magnetoresistance (GMR) element is provided.

As the material of the nonmagnetic layer A3, a known material capable of being used for the nonmagnetic layer of the magnetoresistance effect element A can be used. When the nonmagnetic layer A3 is made of an insulator (when the nonmagnetic layer A3 is a tunnel barrier layer), $Al_2O_3$, $SiO_2$, MgO, $MgAl_2O_4$, $ZnA_2O_4$, $MgGa_2O_4$, $ZnGa_2O_4$, $MgIn_2O_4$, $ZnIn_2O_4$, a multilayer film or a mixed composition film of these materials, and the like can be used as the material of the nonmagnetic layer A3. In addition to these, materials in which some of Al, Si, and Mg are substituted with Zn, Be, or the like can also be used. Among these, MgO and $MgAl_2O_4$ are materials that can implement a coherent tunnel, and therefore can have a large magnetoresistance ratio (MR ratio). On the other hand, when the nonmagnetic layer A3 is made of a metal, Cu, Al, Ag, or the like can be used as a material thereof.

When the nonmagnetic layer A3 is made of an insulator (when the nonmagnetic layer A3 is a tunnel barrier layer), it is preferable that a thickness of the nonmagnetic layer A3 be, for example, 2.5 nm or more, from a viewpoint of setting a high element resistance value.

[Magnetization Free Layer A1]

The magnetization free layer A1 corresponds to a magnetic domain wall drive layer (a magnetization recording layer) of a magnetic domain wall drive type (moving type) MRAM.

The magnetization free layer A1 is made of a ferromagnetic material and the magnetization direction in the inside thereof can be reversed. The magnetization free layer A1 includes a first region A11 in which the magnetization is oriented in a second direction opposite to a direction of the magnetization fixed layer A2, a second region A12 in which the magnetization is oriented in the same direction as the first direction, and a magnetic domain wall DW that forms an interface of these regions. The magnetization directions of the first region A11 and the second region A12 between which the magnetic domain wall DW is sandwiched are opposite to each other. The magnetic domain wall DW is moved by changing the composition ratio of the first region A11 and the second region A12 in the magnetization free layer A1.

As the material of the magnetization free layer A1, a known material can be used, and a soft magnetic material can be particularly applied. For example, it is possible to use a metal selected from the group consisting of Cr, Mn, Co, Fe, and Ni, an alloy containing one or more of these metals, an alloy containing these metals and at least one element of B, C, and N, and the like. Specifically, Co—Fe, Co—Fe—B, and Ni—Fe are used as the material of the magnetization free layer A1.

As the material of the magnetization free layer A1, a material having small saturation magnetization can be used. For example, when a material having small saturation magnetization such as (MnGa) As, (InFe) As, a Co/Tb multilayer film, or GdFeCo is used, the magnetic domain wall DW of the magnetization free layer A1 can be driven with a small current density. Also, when these materials are used, the drive speed of the magnetic domain wall DW becomes low.

A material with weak magnetic anisotropy like NiFe has a high drive speed of the magnetic domain wall DW and the magnetic domain wall DW operates at a speed of 100 msec or more. That is, the magnetic domain wall DW moves a distance of 1 μm with a pulse of 10 nsec. Therefore, when the magnetization free layer A1 is moved in an analog manner within the element, a countermeasure such as applying a minute pulse using an expensive semiconductor circuit or sufficiently lengthening the magnetic domain wall drive layer at the expense of the degree of integration is necessary. On the other hand, in the case of a material with a slow drive speed of the magnetic domain wall DW, an analog memory can be formed even when a sufficiently long pulse current is applied or the length of the magnetization free layer A1 is short.

When the magnetization free layer A1 is a perpendicular magnetization film, a perpendicular magnetization film selected from the group consisting of a Co/Pt multilayer film, a Co/Pd multilayer film, and a CoCrPt alloy film is preferable. Also, a perpendicular magnetization film of $Mn_3X$ (X=Ga, Ge) or a perpendicular magnetization film of a multilayer such as Co/Ni can be used. These materials can drive the magnetic domain wall DW even if the current density for driving the magnetic domain wall is small.

The length in which the magnetization free layer A1 extends in the longitudinal direction is preferably 60 nm or more. If the length is less than 60 nm, the magnetization free layer A1 tends to be a single domain and the magnetic domain wall DW is not easily formed within the magnetization free layer A1.

Although the thickness of the magnetization free layer A1 is not particularly limited as long as the magnetization free layer A1 functions as a magnetic domain wall drive layer, the thickness may be, for example, 2 to 60 nm. When the thickness of the magnetization free layer A1 is 60 nm or more, a possibility that a magnetic domain wall will be formed in a lamination direction increases. However, whether or not the magnetic domain wall is formed in the lamination direction is determined by a balance with the shape anisotropy of the magnetization free layer A1. If the thickness of the magnetization free layer A1 is less than 60 nm, it is unlikely that a magnetic domain wall DW will be formed.

The magnetization free layer A1 may have a magnetic domain wall pinning part which stops movement of the magnetic domain wall DW on a side surface of a layer. For example, the movement of the magnetic domain wall can be stopped (pinned) by providing irregularities, grooves, bulges, constrictions, cutouts, and the like at positions where the movement of the magnetic domain wall DW of the magnetization free layer A1 is desired to be stopped. When the magnetic domain wall pinning part is provided, the magnetic domain wall can be configured so that the magnetic domain wall does not move if an electric current of a threshold value or more does not flow and the output signal is not analog and is easily multi-leveled.

For example, it is possible to more stably hold the magnetic domain wall DW, enable stable multi-level recording, and read a more stably multi-leveled output signal by forming the magnetic domain wall pinning part at every predetermined distance.

The magnetoresistance effect element provided in the present invention may include a layer other than the above-described layers as long as it functions as a magnetoresistance effect element. For example, although the magnetization free layer is only the magnetization free layer A1 serving as the magnetization recording layer having the magnetic domain wall DW in the magnetoresistance effect element A shown in FIG. 3, another magnetization free layer (hereinafter referred to as a second magnetization free layer) may be provided in a central region of the magnetization free layer A1 between the magnetization free layer A1 and the nonmagnetic layers A3 (a region which overlaps the magnetization fixed layer A2 in plan view) in addition to the magnetization free layer A1. The second magnetization free layer is magnetically coupled to the magnetization free layer A1 and its magnetization state changes depending upon the magnetization state of the central region of the magnetization free layer A1.

In the example shown in FIG. 3, in order to form the magnetic domain wall DW, a first magnetization supply layer A4 having magnetization in a first direction that is the same as the magnetization of the first region A11 and a second magnetization supply layer A5 having magnetization in a second direction that is the same as the magnetization of the second region A12 are provided at each of both ends that do not overlap the magnetization fixed layer A2 in plan view within the magnetization free layer A1.

As the material of the first magnetization supply layer A4 and the second magnetization supply layer A5, a material which is the same as the ferromagnetic material used for the magnetization fixed layer A2 can be used.

Although the first magnetization supply layer A4 and the second magnetization supply layer A5 are used as layers in which the magnetization is fixed at one of both ends of the magnetization free layer A1 to form the magnetic domain wall DW in the example shown in FIG. 3, a spin orbit torque (SOT) wiring that is in contact with the magnetization free layer A1 and extends in a direction intersecting the longitudinal direction of the magnetization free layer A1 may be used at one or both of the ends. The spin orbit torque wiring is made of a material that generates a pure spin current according to the spin Hall effect when an electric current flows.

According to this configuration, it is possible to introduce a magnetic domain wall into the magnetization free layer A1 by causing an electric current to flow through both ends of the spin orbit torque wiring even when a magnetization supply layer is not installed as a layer with fixed magnetization. Also, the magnetic domain wall can be moved by causing an electric current to flow through the magnetization free layer A1 via the spin orbit torque wiring.

Although the first magnetization supply layer A4 and the second magnetization supply layer A5 are used as layers in which the magnetization is fixed at one of both ends of the magnetization free layer A1 to form the magnetic domain wall DW in the example shown in FIG. 3, magnetic field application wiring that is electrically insulated from the magnetization free layer A1 and extends in a direction intersecting the magnetization free layer A1 may be used at one or both of the ends. A magnetic field is generated according to Ampere's law by causing an electric current to flow through the magnetic field application wiring. The direction of the generated magnetic field can be reversed according to the direction of the current flowing through the magnetic field application wiring. Thus, it is possible to supply magnetization in one in-plane magnetization direction between in-plane magnetization directions opposite to each other to the end of the magnetization free layer A1 in accordance with the direction of the electric current flowing through the magnetic field application wiring by making an arrangement so that the in-plane magnetization can be supplied to the end of the magnetization free layer A1. Also, it is possible to supply magnetization in one perpendicular magnetization direction between perpendicular magnetization directions opposite to each other to the end of the magnetization free layer A1 in accordance with the direction of the electric current flowing through the magnetic field application wiring by making an arrangement so that the perpendicular magnetization can be supplied to the end of the magnetization free layer A1.

Also, although the first magnetization supply layer A4 and the second magnetization supply layer A5 are used as layers in which the magnetization is fixed at one of both ends of the magnetization free layer A1 to form the magnetic domain wall DW in the example shown in FIG. 3, a voltage application terminal connected to the magnetization free layer A1 via an insulating layer may be used at one or both of the ends. When a voltage is applied between the magnetization fixed layer A2 and the voltage application terminal, a part of the magnetization of the magnetization free layer A1 is affected by the voltage. For example, when a voltage is applied with a pulse from the voltage application terminal, a part of the magnetization is oriented in a direction perpendicular to the magnetization direction of the magnetization free layer A1 at the time of voltage application and the magnetization of the magnetization free layer A1 is oriented in a first direction or a second direction opposite to the first direction at a timing when the voltage application stops. There is an equal probability of the magnetization oriented in the orthogonal direction falling in the first direction or the second direction opposite to the first direction and it is possible to change an orientation of a part of the magnetization from the first direction to the second direction by adjusting a timing at which the pulse voltage is applied, the number of times that the pulse voltage is applied, and a period in which the pulse voltage is applied.

A magnetic coupling layer may be installed between the magnetization free layer A1 and the nonmagnetic layer A3. The magnetic coupling layer is a layer that transfers the magnetization state of the magnetization free layer A1. A main function of the magnetization free layer A1 is a layer for driving the magnetic domain wall and it is not always possible to select a material suitable for the magnetoresistance effect generated via the magnetization fixed layer A2 and the nonmagnetic layer A3. In general, it is known that a ferromagnetic material having a BCC structure is good for the magnetization fixed layer A2 and the magnetic coupling layer in order to generate a coherent tunnel effect using the nonmagnetic layer A3. In particular, it is known that a large output can be obtained when a material having a composition of Co—Fe—B is formed by sputtering as the material of the magnetization fixed layer A2 and the magnetic coupling layer.

Figure 4:
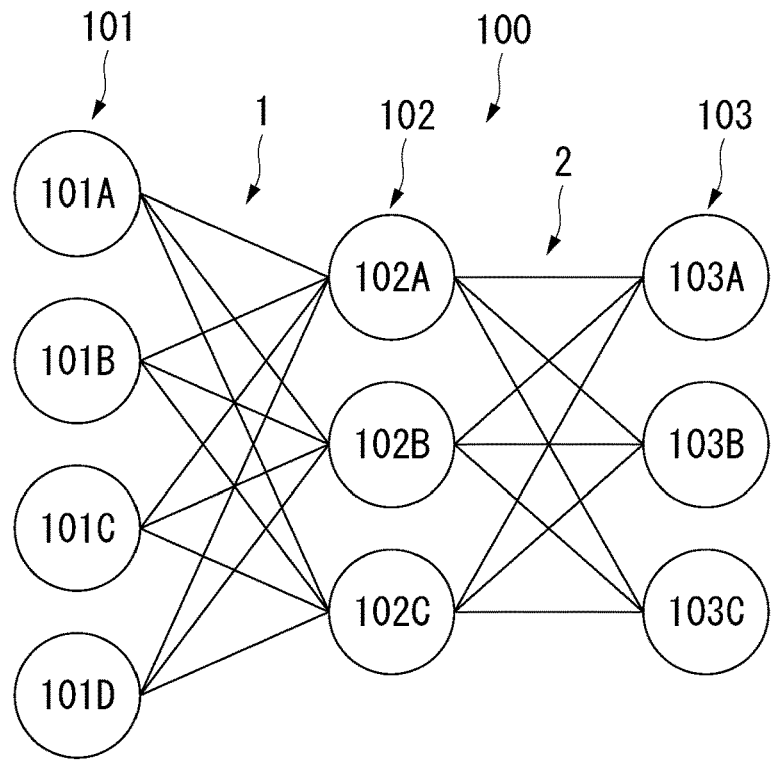
FIG. 4 is a diagram showing an application example of the multiply and accumulate calculation device according to the first embodiment.

FIG. 4 is a diagram showing an application example of the multiply and accumulate calculation device 1 according to the first embodiment.

In the example shown in FIG. 4, the multiply and accumulate calculation device 1 of the first embodiment is applied to the neuromorphic device 100. The neuromorphic device 100 includes an input layer 101, a hidden layer 102, an output layer 103, and a multiply and accumulate calculation device 1 and a multiply and accumulate calculation device 2 of the first embodiment. The multiply and accumulate calculation device 2 has a plurality of multiple calculation elements similar to those of the multiply and accumulate calculation device 1 of the first embodiment shown in FIG. 1.

The input layer 101 includes, for example, four nodes 101A, 101B, 101C, and 101D. The hidden layer 102 includes, for example, three nodes 102A, 102B, and 102C. The output layer 103 includes, for example, three nodes 103A, 103B, and 103C.

The multiply and accumulate calculation device 1 is disposed between the input layer 101 and the hidden layer 102 and connects the four nodes 101A, 101B, 101C, and 101D of the input layer 101 and the three nodes 102A, 102B, and 102C of the hidden layer 102. The multiply and accumulate calculation device 1 changes weights by changing the resistance values of the multiple calculation elements 10AA, 10AB, and 10BA to 10BD shown in FIG. 1.

The multiply and accumulate calculation device 2 is disposed between the hidden layer 102 and the output layer 103. The multiply and accumulate calculation device 2 connects the three nodes 102A, 102B, and 102C of the hidden layer 102 and the three nodes 103A, 103B, and 103C of the output layer 103. The multiply and accumulate calculation device 2 changes weights by changing the resistance values of the plurality of multiple calculation elements.

The hidden layer 102 uses an activation function (for example, a sigmoid function).

Incidentally, the resistance values of the multiple calculation elements 10AA, 10AB, and 10BA to 10BD constituting the multiply and accumulate calculation device 1 fluctuate in accordance with a change in the temperature. In detail, the resistance values of the multiple calculation elements 10AA, 10AB, and 10BA to 10BD, which are the magnetoresistance effect elements A, different from ordinary resistors decrease as the temperature increases. That is, the resistance values of the multiple calculation elements 10AA, 10AB, and 10BA to 10BD have temperature dependency different from that of a normal resistor.

The present inventors have found that a discrimination function of the neuromorphic device 100 deteriorates when the discrimination of the neuromorphic device 100 is performed without taking into account a change in the resistance values of the multiple calculation elements 10AA, 10AB, and 10BA to 10BD according to the change in the temperature in an intensive study.

Also, for example, the present inventors have found that the resistance values of the multiple calculation elements 10AA, 10AB, and 10BA to 10BD when the electric current flows from the input unit 12 to the output detectors 11A and 11B (when the electric current flows in the forward direction) are different from the resistance values of the multiple calculation elements 10AA, 10AB, and 10BA to 10BD when the electric current flows from the output detectors 11A and 11B to the input unit 12 (when the electric current flows in the reverse direction). That is, the present inventors have found that the resistance values of the multiple calculation elements 10AA, 10AB, and 10BA to 10BD have bias dependency (depending upon a voltage and polarity).

In view of this point, the following countermeasures are implemented in the multiply and accumulate calculation device 1 of the first embodiment.

Specifically, in the example shown in FIG. 1, as described above, the multiply and accumulate calculation device 1 includes the reference element 10AMAX and the reference element 10AMIN. Unlike the multiple calculation elements 10AA, 10AB, and 10BA to 10BD, the reference elements 10AMAX and 10AMIN are reference magnetoresistance effect elements that have a magnetization free layer that does not have a magnetic domain wall, a magnetization fixed layer in which a magnetization direction is fixed, and a nonmagnetic layer sandwiched between the magnetization free layer and the magnetization fixed layer and that have a fixed relative angle formed by the magnetization direction of the magnetization free layer and the magnetization direction of the magnetization fixed layer or reference magnetoresistance effect elements that have a magnetization free layer having a magnetic domain wall, a magnetization fixed layer in which a magnetization direction is fixed, and a nonmagnetic layer sandwiched between the magnetization free layer and the magnetization fixed layer and that have a substantially fixed relative angle formed by each of a plurality of magnetization directions of the magnetization free layer having the magnetic domain wall and the magnetization direction of the magnetization fixed layer. The reference magnetoresistance effect element having the substantially fixed relative angle can be implemented by setting a value of the reference magnetoresistance effect element to a determined initial value at a point in time when the multiply and accumulate calculation device is initialized and operating the initial value as a substantially fixed value by using the initial value without changing a value from the initial value at the time of the subsequent multiply and accumulate calculation. As the set value of the reference magnetoresistance effect element, a maximum or minimum value may be used, or a value between any maximum and minimum may be selected. As the magnetization free layer that does not have a magnetic domain wall, a layer that does not have a magnetic domain wall in a region overlapping the magnetization fixed layer A2 in plan view within the magnetization free layer A1 may be used. As a method of fixing the relative angle, a known method can be used. It is preferable that the reference elements 10AMAX and 10AMIN have a layer configuration (a material and a layer thickness) which is the same as or similar to those of the multiple calculation elements 10AA, 10AB, and 10BA to 10BD, except for the presence or absence of the magnetic domain wall, so that the comparison with the multiple calculation elements 10AA, 10AB, and 10BA to 10BD, which are magnetoresistance effect elements, is facilitated (or so that calibration can be facilitated). A layer in which a magnetization direction is fixed may be used as the magnetization free layer that does not have a magnetic domain wall in the reference elements 10AMAX and 10AMIN.

The reference elements 10AMAX and 10AMIN are used to prevent changes in resistance values of the multiple calculation elements 10AA, 10AB, and 10BA to 10BD according to a change in temperature from adversely affecting the discrimination function of the neuromorphic device 100.

In detail, the reference element 10AMAX is used to prevent changes in resistance values of the multiple calculation elements 10AA, 10AB, and 10BA to 10BD according to a change in temperature from adversely affecting the discrimination function of the neuromorphic device 100 when the electric current flows from the input unit 12 to the output detectors 11A and 11B. In the reference element 10AMAX, the magnetization direction of the magnetization free layer and the magnetization direction of the magnetization fixed layer may be antiparallel.

Also, the reference element 10AMIN is used to prevent changes in resistance values of the multiple calculation elements 10AA, 10AB, and 10BA to 10BD according to a change in temperature from adversely affecting the discrimination function of the neuromorphic device 100 when the electric current flows from the output detectors 11A and 11B to the input unit 12. In the reference element 10AMIN, the magnetization direction of the magnetization free layer and the magnetization direction of the magnetization fixed layer may be parallel.

As the magnetization free layer of the reference element having a magnetic domain wall, a layer having a magnetic domain wall in a region overlapping the magnetization fixed layer A2 in plan view within the magnetization free layer A1 may be used. As a method of fixing the relative angle formed by each of the plurality of magnetization directions of the magnetization free layer of the reference element having a magnetic domain wall and the magnetization direction of the magnetization fixed layer of the reference element, it is possible to use a method of setting a value of the reference magnetoresistance effect element to a determined initial value at a point in time when the multiply and accumulate calculation device is initialized and operating the initial value as a substantially fixed value by using the initial value without changing a value from the initial value at the time of the subsequent multiply and accumulate calculation. Also in this case, it is preferable that the reference elements 10AMAX and 10AMIN have a layer configuration (a material and a layer thickness) which is the same as or similar to those of the multiple calculation elements 10AA, 10AB, and 10BA to 10BD so that the comparison with the multiple calculation elements 10AA, 10AB, and 10BA to 10BD, which are magnetoresistance effect elements, is facilitated (or so that calibration can be facilitated).

When a reference element including a magnetization free layer having a magnetic domain wall is used, the relationship between the read current direction and the magnetization direction of the magnetization supply layers A4 and A5 may be adjusted so that the magnetic domain wall is not shifted at the time of reading. For example, in the reference element having the maximum value, a direction of magnetization of the magnetization supply layer on the side where the read current flows may be arranged so that it is antiparallel to the magnetization of the magnetization fixed layer A2 and a direction of the magnetization of the other magnetization supply layer may be arranged so that it is parallel to the magnetization of the magnetization fixed layer A2. Also, in the reference element having the minimum value, a direction of magnetization of the magnetization supply layer on the side where the read current flows may be arranged so that it is parallel to the magnetization of the magnetization fixed layer A2 and a direction of the magnetization of the other magnetization supply layer may be arranged so that it is antiparallel to the magnetization of the magnetization fixed layer A2.

Also, in the example shown in FIG. 2, as described above, the comparison unit 14 is provided in the multiply and accumulate calculation device 1. The comparison unit 14 compares outputs from the multiple calculation elements 10AA, 10AB, and 10BA to 10BD with outputs from the reference elements 10AMAX and 10AMIN.

In detail, when the electric current flows from the input unit 12 to the output detectors 11A and 11B (when the electric current flows in the forward direction), for example, the comparison unit 14 compares the output from the multiple calculation element 10AA with the output from the reference element 10AMAX. For example, the forward output current from the multiple calculation element 10AA is compared with the forward output current from the reference element 10AMAX and therefore it is possible to ascertain a degree of change in the resistance value of the multiple calculation element 10AA through which the forward output current flows under the temperature condition at that time.

Also, for example, the comparison unit 14 compares an output from the multiple calculation element 10AA with an output from the reference element 10AMIN when the electric current flows from the output detectors 11A and 11B to the input unit 12 (when the electric current flows in the reverse direction). For example, the reverse output current from the multiple calculation element 10AA is compared with the reverse output current from the reference element 10AMIN and therefore it is possible to ascertain a degree of change in the resistance value of the multiple calculation element 10AA through which the reverse output current flows under the temperature condition at that time.

Also, in the example shown in FIG. 2, the correction unit 15 is provided in the multiply and accumulate calculation device 1 as described above.

When the electric current flows from the input unit 12 to the output detectors 11A and 11B (when the electric current flows in the forward direction), the correction unit 15 calculates an amount of change in a resistance value depending upon the temperature of the multiple calculation element 10AA through which the forward output current flows on the basis of, for example, an output from the multiple calculation element 10AA and an output from the reference element 10AMAX. Also, the correction unit 15 corrects the resistance value of the multiple calculation element 10AA through which the forward output current flows on the basis of the amount of change in the resistance value depending upon the temperature of the multiple calculation element 10AA through which the forward output current flows. Likewise, the correction unit 15 corrects the resistance values of the multiple calculation elements 10AB and 10BA to 10BD through which the forward output current flows.

When the electric current flows from the output detectors 11A and 11B to the input unit 12 (when the electric current flows in the reverse direction), the correction unit 15 calculates an amount of change in the resistance value depending upon the temperature of the multiple calculation element 10AA through which the reverse direction output current flows on the basis of, for example, an output from the multiple calculation element 10AA and an output from the reference element 10AMIN. Also, the correction unit 15 corrects the resistance value of the multiple calculation element 10AA through which the reverse output current flows on the basis of the amount of change in the resistance value depending upon the temperature of the multiple calculation element 10AA through which the reverse output current flows. Likewise, the correction unit 15 corrects the resistance values of the multiple calculation elements 10AB and 10BA to 10BD through which the reverse direction output current flows.

Thus, in the multiply and accumulate calculation device 1 of the first embodiment, it is possible to minimize deterioration in the discrimination function of the neuromorphic device 100 according to changes in the resistance values of the multiple calculation elements 10AA, 10AB, and 10BA to 10BD according to a change in temperature as compared with a case in which the reference elements 10AMAX and 10AMIN are not provided.

Also, in the example shown in FIG. 2, as described above, the failure detection unit 13 is provided in the multiply and accumulate calculation device 1. The failure detection unit 13 determines whether or not the multiple calculation element 10AA or the like has failed.

For example, when the output from the multiple calculation element 10AA detected by the output detector 11A has exceeded a specified value, the failure detection unit 13 determines that a failure that increases the output current has occurred in the multiple calculation element 10AA.

Also, for example, the failure detection unit 13 determines that a failure that increases the output current has occurred in at least any one of the plurality of multiple calculation elements 10BA to 10BD included in the column 10B when the total value of outputs from the plurality of multiple calculation elements 10BA to 10BD detected by the output detector 11B has exceeded a specified value.

Figure 5:
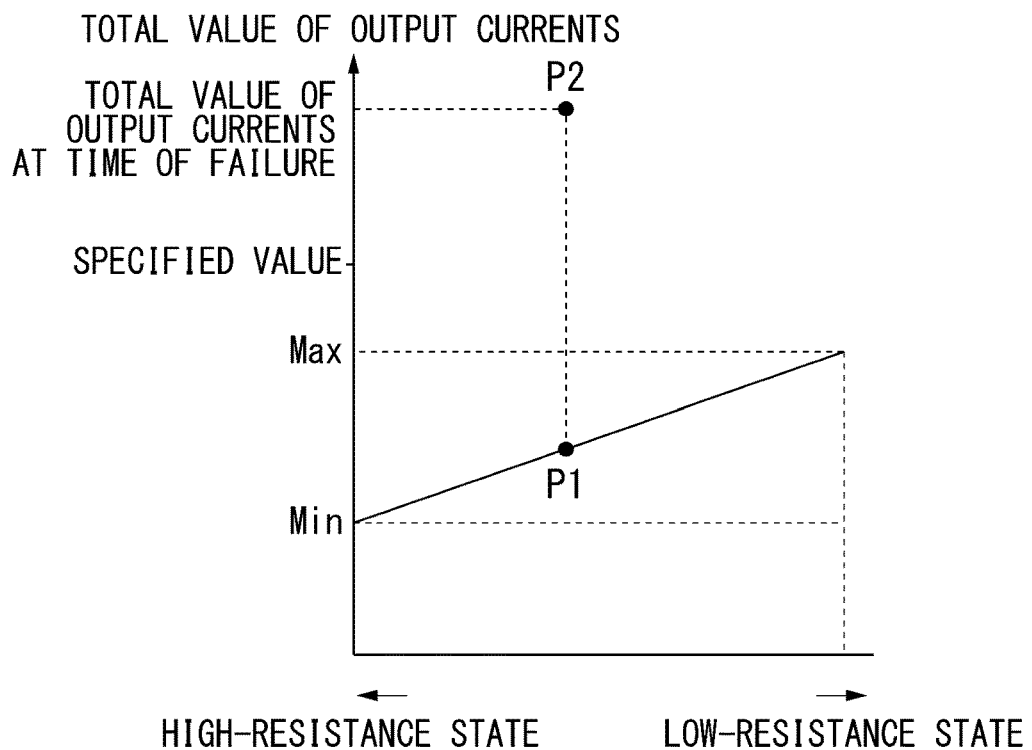
FIG. 5 is an explanatory diagram showing a total value detected by an output detector and a specified value.

FIG. 5 is an explanatory diagram showing a total value detected by the output detector 11B and the specified value. In FIG. 5, the vertical axis indicates the total value of the output currents of the plurality of multiple calculation elements 10BA to 10BD detected by the output detector 11B, the specified value, and the like. The horizontal axis represents states of the multiple calculation elements 10BA to 10BD (magnitudes of resistance values thereof).

At the time which is the time of a normal operation of the plurality of multiple calculation elements 10BA to 10BD and when the resistance values of the multiple calculation elements 10BA to 10BD are largest, the total value of the output currents of the plurality of multiple calculation elements 10BA to 10BD detected by the output detector 11B becomes a minimum value Min.

In accordance with a decrease in the resistance values of the plurality of multiple calculation elements 10BA to 10BD at the time of the normal operation of the plurality of multiple calculation elements 10BA to 10BD, the total value of the output currents of the plurality of multiple calculation elements 10BA to 10BD detected by the output detector 11B increases.

At the time which is the time of a normal operation of the plurality of multiple calculation elements 10BA to 10BD and when the resistance values of the multiple calculation elements 10BA to 10BD are smallest, the total value of the output currents of the plurality of multiple calculation elements 10BA to 10BD detected by the output detector 11B becomes a maximum value Max.

The specified value is set to a value greater than or equal to the maximum value Max. That is, the specified value is a value greater than or equal to the maximum value Max of the total value that can be detected by the output detector 11B when all the plurality of multiple calculation elements 10BA to 10BD operate normally.

In the example shown in FIG. 5, in the state of a point P1, the total value of the output currents of the multiple calculation elements 10BA to 10BD detected by the output detector 11B does not exceed the specified value. Thus, the failure detection unit 13 determines that there is a high possibility that a failure that increases the output current will not occur in any one of the plurality of multiple calculation elements 10BA to 10BD included in the column 10B.

On the other hand, in the state of a point P2, the total value of the output currents of the multiple calculation elements 10BA to 10BD detected by the output detector 11B exceeds the specified value. Thus, the failure detection unit 13 determines that a failure that increases the output current has occurred in at least one of the plurality of multiple calculation elements 10BA to 10BD included in the column 10B.

Also, in the examples shown in FIGS. 1 and 2, the failure detection unit 13 determines whether or not each of the plurality of multiple calculation elements 10AA and 10AB has failed.

For example, in order to determine whether or not the multiple calculation element 10AA has failed, the output detector 11A detects the output from the multiple calculation element 10AA in a state in which the second input unit 12B does not input a signal to the multiple calculation element 10AB, a state in which the third input unit 12C does not input a signal to the reference element 10AMAX, a state in which the fourth input unit 12D does not input a signal to the reference element 10AMIN, and a state where the first input unit 12A inputs a signal to the multiple calculation element 10AA. In this state, the output from the multiple calculation element 10AB is zero, the output from the reference element 10AMAX is zero, and the output from the reference element 10AMIN is zero. Also, the failure detection unit 13 determines whether or not the multiple calculation element 10AA has failed on the basis of a detected value of the output detector 11A.

Likewise, the failure detection unit 13 determines whether or not the multiple calculation element 10AB has failed.

Also, in the example shown in FIGS. 1 and 2, the failure detection unit 13 determines whether or not each of the plurality of multiple calculation elements 10BA, 10BB, 10BC, and 10BD has failed.

For example, in order to determine whether or not the multiple calculation element 10BB has failed, the output detector 11B detects the output from the multiple calculation element 10BB in a state in which the first input unit 12A does not input a signal to the multiple calculation element 10BA, a state in which the third input unit 12C does not input a signal to the multiple calculation element 10BC, a state in which the fourth input unit 12D does not input a signal to the multiple calculation element 10BD, and a state in which the second input unit 12B inputs a signal to the multiple calculation element 10BB. In this state, the output from the multiple calculation element 10BA is zero, the output from the multiple calculation element 10BC is zero, and the output from the multiple calculation element 10BD is zero. Also, the failure detection unit 13 determines whether or not the multiple calculation element 10BB has failed on the basis of a detected value of the output detector 11B.

Likewise, the failure detection unit 13 determines whether or not the multiple calculation element 10BA has failed, whether or not the multiple calculation element 10BC has failed, and whether or not the multiple calculation element 10BD has failed.

Figure 6:
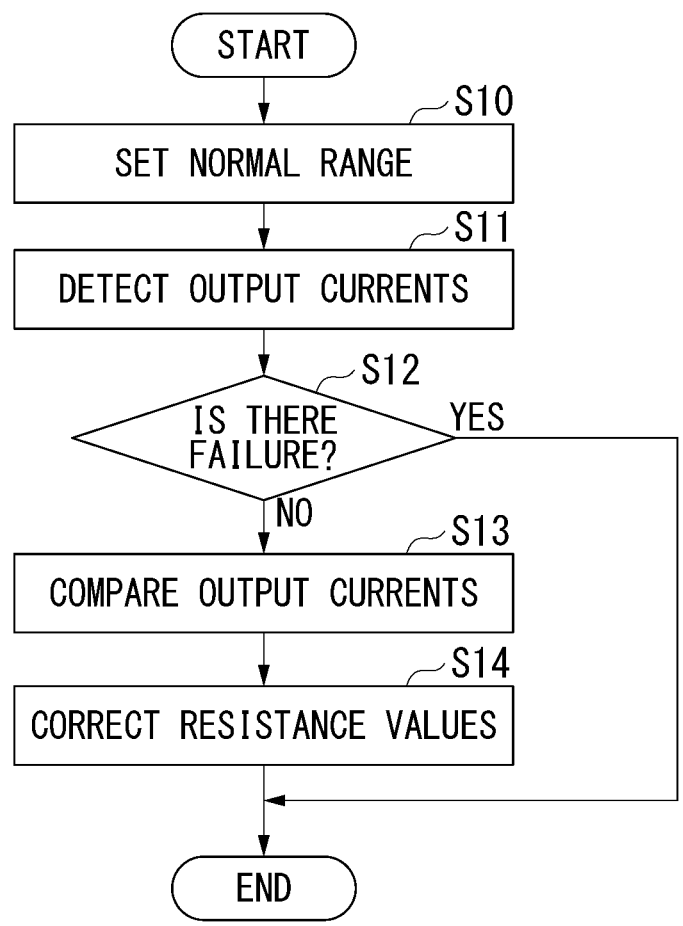
FIG. 6 is a flowchart showing an example of a process to be executed by the multiply and accumulate calculation device according to the first embodiment.

FIG. 6 is a flowchart showing an example of a process to be executed by the multiply and accumulate calculation device 1 of the first embodiment.

In the example shown in FIG. 6, the multiply and accumulate calculation device 1 has an operation mode in which the electric current flows from the input unit 12 to the output detectors 11A and 11B and a back-propagation mode in which the electric current flows from the output detectors 11A and 11B to the input unit 12.

When the multiply and accumulate calculation device 1 is in the operation mode, the failure detection unit 13 sets a normal range of forward outputs from the multiple calculation elements 10AA, 10AB, and 10BA to 10BD in step S10. In detail, for example, the failure detection unit 13 sets a range of the "specified value" or less of FIG. 5 as a normal range of the total value of the forward outputs from the plurality of multiple calculation elements 10BA to 10BD. Also, the failure detection unit 13 sets the normal range of the forward output from each of the multiple calculation elements 10AA, 10AB, and 10BA to 10BD. For example, when the multiple calculation element 10AA operates normally, the failure detection unit 13 sets a range of the maximum current value or less capable of being output by the multiple calculation element 10AA in the forward direction as a normal range of the forward output from the multiple calculation element 10AA.

Next, in step S11, the output detector 11A detects forward output currents from the multiple calculation elements 10AA and 10AB and the reference element 10AMAX. In detail, when the first input unit 12A inputs a signal to the multiple calculation element 10AA, the second input unit 12B does not input a signal to the multiple calculation element 10AB, the third input unit 12C does not input a signal to the reference element 10AMAX, and the fourth input unit 12D does not input a signal to the reference element 10AMIN, the output detector 11A detects the forward output current from the multiple calculation element 10AA. Likewise, the output detector 11A detects the forward output current from the multiple calculation element 10AB and the forward output current from the reference element 10AMAX.

Also, in step S11, the output detector 11B detects the forward output from the multiple calculation elements 10BA to 10BD. In detail, the output detector 11B detects the total value of the forward output currents from the multiple calculation elements 10BA to 10BD. Also, the output detector 11B detects each of a forward output current from the multiple calculation element 10BA, a forward output current from the multiple calculation element 10BB, a forward output current from the multiple calculation element 10BC, and a forward output current from the multiple calculation element 10BD.

Next, in step S12, the failure detection unit 13 determines the presence or absence of a failure of the plurality of multiple calculation elements 10AA, 10AB, and 10BA to 10BD. In detail, the failure detection unit 13 determines whether or not a plurality of multiple calculation elements 10BA to 10BD include a failed multiple calculation element on the basis of the total value of the forward output currents from the multiple calculation elements 10BA to 10BD detected by the output detector 11B and the normal range of the total value of the forward outputs from the multiple calculation elements 10BA to 10BD. When the total value of the forward output currents from the multiple calculation elements 10BA to 10BD detected by the output detector 11B exceeds the normal range of the total value of the forward outputs from the multiple calculation elements 10BA to 10BD, the failure detection unit 13 determines that the plurality of multiple calculation elements 10BA to 10BD include a failed multiple calculation element and ends the routine shown in FIG. 6.

Also, in step S12, the failure detection unit 13 determines whether or not the multiple calculation elements 10AA and 10AB have failed on the basis of the forward output current from each of the multiple calculation elements 10AA and 10AB detected by the output detector 11A and the normal range of the forward output from each of the multiple calculation elements 10AA and 10AB. When the forward output current from the multiple calculation element 10AA detected by the output detector 11A exceeds the normal range of the forward output from the multiple calculation element 10AA, the failure detection unit 13 determines that the multiple calculation element 10AA has failed and ends the routine shown in FIG. 6. Also, the routine shown in FIG. 6 ends when the failure detection unit 13 determines that the multiple calculation element 10AB has failed.

Also, in step S12, the failure detection unit 13 determines whether or not the multiple calculation elements 10BA to 10BD have failed on the basis of the forward output current from each of the multiple calculation elements 10BA to 10BD detected by the output detector 11B and the normal range of the forward output from each of the multiple calculation elements 10BA to 10BD. When the forward output current from the multiple calculation element 10BA detected by the output detector 11B exceeds the normal range of the forward output from the multiple calculation element 10BA, the failure detection unit 13 determines that the multiple calculation element 10BA has failed and ends the routine shown in FIG. 6. Also, the routine shown in FIG.

6 ends when the failure detection unit 13 determines that any one of the multiple calculation elements 10BB to 10BD has failed.

When the failure detection unit 13 determines that the plurality of multiple calculation elements 10AA, 10AB, and 10BA to 10BD have not failed in step S12, the process proceeds to step S13.

In step S13, the comparison unit 14 compares the forward output current from the multiple calculation element 10AA detected by the output detector 11A with the forward output current from the reference element 10AMAX detected by the output detector 11A.

In step S13, the comparison unit 14 may compare the forward output current from the multiple calculation element 10AB detected by the output detector 11A or the forward output current from any one of the multiple calculation elements 10BA to 10BD detected by the output detector 11B with the forward output current from the reference element 10AMAX detected by the output detector 11A.

Next, in step S14, the correction unit 15 determines whether or not the discrimination function of the neuromorphic device 100 is likely to deteriorate when the forward resistance values of the multiple calculation elements 10AA, 10AB, and 10BA to 10BD are not corrected on the basis of a comparison result by the comparison unit 14. When the discrimination function of the neuromorphic device 100 is likely to deteriorate if the forward resistance values of the multiple calculation elements 10AA, 10AB, and 10BA to 10BD are not corrected, the correction unit 15 corrects the forward resistance values of the multiple calculation elements 10AA, 10AB, and 10BA to 10BD.

In detail, the correction unit 15 calculates an amount of change in a resistance value depending upon the temperature of the multiple calculation element 10AA on the basis of the forward output current from the multiple calculation element 10AA detected by the output detector 11A and the forward output current from the reference element 10AMAX detected by the output detector 11A. Also, the correction unit 15 corrects the forward resistance value of the multiple calculation element 10AA on the basis of the amount of change in the resistance value.

Specifically, when the forward resistance value of the multiple calculation element 10AA is smaller than a desired forward resistance value due to an increase in the temperature, the correction unit 15 performs correction for increasing the forward resistance value of the multiple calculation element 10AA. Also, when the forward resistance value of the multiple calculation element 10AA is larger than the desired forward resistance value due to a decrease in the temperature, the correction unit 15 performs correction for decreasing the forward resistance value of the multiple calculation element 10AA. Likewise, the correction unit 15 corrects the forward resistance values of the multiple calculation elements 10AB and 10BA to 10BD.

When the multiply and accumulate calculation device 1 is in the back-propagation mode, the failure detection unit 13 sets the normal range of the total value of reverse outputs from the multiple calculation elements 10BA to 10BD in step S10. Also, the failure detection unit 13 sets a normal range of a reverse output from each of the multiple calculation elements 10AA, 10AB, 10BA to 10BD.

Next, in step S11, the output detector 11A detects a reverse output current flowing through each of the multiple calculation elements 10AA and 10AB and the reference element 10AMIN. In detail, when the first input unit 12A turns on a reverse current path, the second input unit 12B turns off the reverse current path, the third input unit 12C turns off the reverse current path, and the fourth input unit 12D turns off the reverse current path, the output detector 11A detects the reverse output current flowing through the multiple calculation element 10AA. Likewise, the output detector 11A detects a reverse output current flowing through the multiple calculation element 10AB and a reverse output current flowing through the reference element 10AMIN.

Also, in step S11, the output detector 11B detects reverse output currents flowing through the multiple calculation elements 10BA to 10BD. In detail, the output detector 11B detects the total value of the reverse output currents flowing through the multiple calculation elements 10BA to 10BD. Also, the output detector 11B detects each of a reverse output current flowing through the multiple calculation element 10BA, a reverse output current flowing through the multiple calculation element 10BB, a reverse output current flowing through the multiple calculation element 10BC, and a reverse output current flowing through the multiple calculation element 10BD.

Next, in step S12, the failure detection unit 13 determines the presence or absence of a failure of the plurality of multiple calculation elements 10AA, 10AB, and 10BA to 10BD. In detail, the failure detection unit 13 determines whether or not a plurality of multiple calculation elements 10BA to 10BD include a failed multiple calculation element on the basis of the total value of the reverse output currents flowing through the multiple calculation elements 10BA to 10BD detected by the output detector 11B and the normal range of the total value of the reverse outputs from the multiple calculation elements 10BA to 10BD. When the total value of the reverse output currents flowing through the multiple calculation elements 10BA to 10BD detected by the output detector 11B exceeds the normal range of the total value of the reverse outputs from the multiple calculation elements 10BA to 10BD, the failure detection unit 13 determines that the plurality of multiple calculation elements 10BA to 10BD include a failed multiple calculation element, and ends the routine shown in FIG. 6.

Also, in step S12, the failure detection unit 13 determines whether or not the multiple calculation elements 10AA and 10AB have failed on the basis of the reverse output current flowing through each of the multiple calculation elements 10AA and 10AB detected by the output detector 11A and the normal range of the reverse output from each of the multiple calculation elements 10AA and 10AB. When the reverse direction output current flowing through the multiple calculation element 10AA detected by the output detector 11A exceeds the normal range of the reverse output from the multiple calculation element 10AA, the failure detection unit 13 determines that the multiple calculation element 10AA has failed and ends the routine shown in FIG. 6. Also, the routine shown in FIG. 6 ends when the failure detection unit 13 determines that the multiple calculation element 10AB has failed.

Also, in step S12, the failure detection unit 13 determines whether or not the multiple calculation elements 10BA to 10BD have failed on the basis of the reverse output current flowing through each of the multiple calculation elements 10BA to 10BD detected by the output detector 11B and the normal range of the reverse output from each of the multiple calculation elements 10BA to 10BD. When the reverse output current flowing through the multiple calculation element 10BA detected by the output detector 11B exceeds the normal range of the reverse output from the multiple calculation element 10BA, the failure detection unit 13 determines that the multiple calculation element 10BA has failed and ends the routine shown in FIG. 6. Also, the routine shown in FIG. 6 ends when the failure detection unit 13 determines that any one of the multiple calculation elements 10BB to 10BD has failed. When the failure detection unit 13 determines that the plurality of multiple calculation elements 10AA, 10AB, and 10BA to 10BD have not failed in step S12, the process proceeds to step S13.

In step S13, the comparison unit 14 compares the reverse output current flowing through the multiple calculation element 10AA detected by the output detector 11A with the reverse output current flowing through the reference element 10AMIN detected by the output detector 11A.

In step S13, the comparison unit 14 may compare the reverse output current flowing through the multiple calculation element 10AB detected by the output detector 11A or the reverse output current flowing through any one of the multiple calculation elements 10BA to 10BD detected by the output detector 11B with the reverse direction output current flowing through the reference element 10AMIN detected by the output detector 11A.

Next, in step S14, the correction unit 15 determines whether or not the discrimination function of the neuromorphic device 100 is likely to deteriorate (in detail, desired back-propagation learning is unlikely to be executed) when the reverse resistance values of the multiple calculation elements 10AA, 10AB, and 10BA to 10BD are not corrected on the basis of a comparison result by the comparison unit 14. When the discrimination function of the neuromorphic device 100 is likely to deteriorate (when desired back-propagation learning is unlikely to be executed) if the reverse resistance values of the multiple calculation elements 10AA, 10AB, and 10BA to 10BD are not corrected, the correction unit 15 corrects the reverse resistance values of the multiple calculation elements 10AA, 10AB, and 10BA to 10BD.

In detail, the correction unit 15 calculates an amount of change in a resistance value depending upon the temperature of the multiple calculation element 10AA on the basis of the reverse output current flowing through the multiple calculation element 10AA detected by the output detector 11A and the reverse output current flowing through the reference element 10AMIN detected by the output detector 11A. Also, the correction unit 15 corrects the reverse resistance value of the multiple calculation element 10AA on the basis of the amount of change in the resistance value.

Specifically, as in the case in which the multiply and accumulate calculation device 1 is in the operation mode, when the reverse resistance value of the multiple calculation element 10AA is smaller than the desired reverse resistance value due to an increase in the temperature, the correction unit 15 performs correction for increasing the reverse resistance value of the multiple calculation element 10AA. Also, when the reverse resistance value of the multiple calculation element 10AA is larger than the desired reverse resistance value due to a decrease in the temperature, the correction unit 15 performs correction for decreasing the reverse resistance value of the multiple calculation element 10AA. Likewise, the correction unit 15 corrects the reverse resistance values of the multiple calculation elements 10AB and 10BA to 10BD.

As described above, in the multiply and accumulate calculation device 1 of the first embodiment, the multiple calculation unit 10 includes the reference elements 10AMAX and 10AMIN having the magnetization free layer that does not have the magnetic domain wall.

Thus, according to the multiply and accumulate calculation device 1 of the first embodiment, it is possible to minimize deterioration in performance of the neural network due to a change in temperature when the multiply and accumulate calculation device 1 is applied to the neural network as compared with a multiply and accumulate calculation device in which such a reference element is not provided in the multiple calculation unit.

Also, in the multiply and accumulate calculation device 1 of the first embodiment, as described above, the reference element 10AMAX in which the magnetization direction of the magnetization free layer and the magnetization direction of the magnetization fixed layer are antiparallel and the reference element 10AMIN in which the magnetization direction of the magnetization free layer and the magnetization direction of the magnetization fixed layer are parallel are provided in the multiple calculation unit 10.

Thus, according to the multiply and accumulate calculation device 1 of the first embodiment, it is possible to minimize deterioration in performance of the neural network due to the change in the temperature when the multiply and accumulate calculation device 1 is in the operation mode and minimize the possibility that the desired back-propagation learning cannot be performed when the multiply and accumulate calculation device 1 is in the back-propagation mode.

Also, as described above, the multiply and accumulate calculation device 1 according to the first embodiment includes the comparison unit 14 that compares outputs from the multiple calculation elements 10AA, 10AB, and 10BA to 10BD with outputs from the reference elements 10AMAX and 10AMIN.

Thus, according to the multiply and accumulate calculation device 1 of the first embodiment, it is possible to minimize deterioration in performance of the neural network due to the change in temperature as compared with a case in which the outputs from the multiple calculation elements 10AA, 10AB, and 10BA to 10BD are not compared with the outputs from the reference elements 10AMAX and 10AMIN.

Also, as described above, the multiply and accumulate calculation device 1 of the first embodiment includes the correction unit 15 that corrects the resistance values of the multiple calculation elements 10AA, 10AB, and 10BA to 10BD in accordance with the change in temperature.

Thus, according to the multiply and accumulate calculation device 1 of the first embodiment, it is possible to minimize deterioration in performance of the neural network due to the change in temperature as compared with a case in which the resistance values of the multiple calculation elements 10AA, 10AB, and 10BA to 10BD are not corrected in accordance with the change in temperature.

Second Embodiment

Hereinafter, a second embodiment of a multiply and accumulate calculation device of the present invention will be described.

The multiply and accumulate calculation device 1 of the second embodiment is configured as in the multiply and accumulate calculation device 1 of the above-described first embodiment, except for differences to be described below. Therefore, according to the multiply and accumulate calculation device 1 of the second embodiment, it is possible to obtain effects similar to those of the multiply and accumulate calculation device 1 of the above-described first embodiment, except for differences to be described below.

Figure 7:
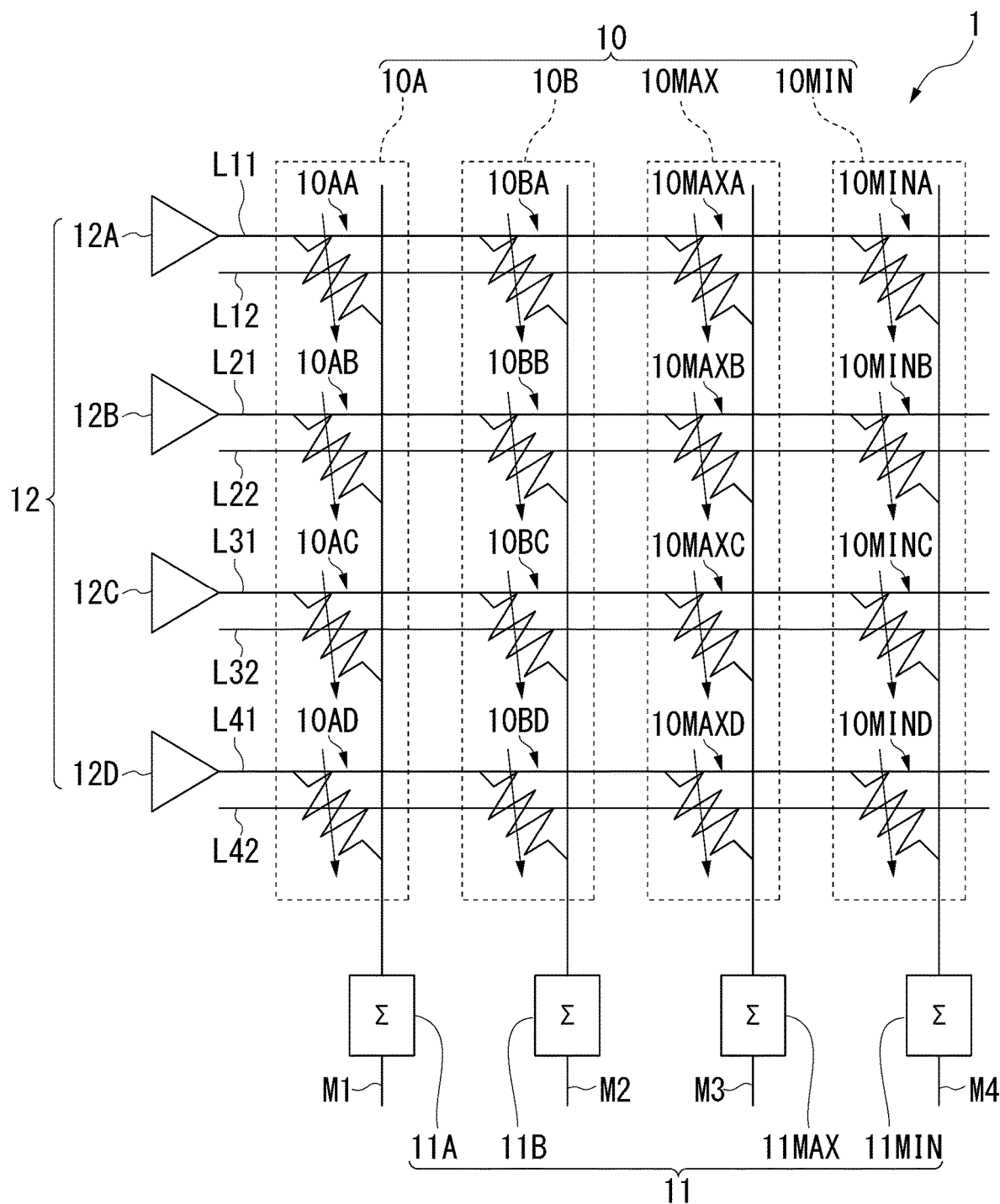
FIG. 7 is a diagram showing an example of a partial configuration of a multiply and accumulate calculation device according to a second embodiment.

FIG. 7 is a diagram showing an example of a partial configuration of the multiply and accumulate calculation device 1 according to the second embodiment.

Although the multiple calculation unit 10 does not include a reference column in the example shown in FIG. 1, a multiple calculation unit 10 includes reference columns 10MAX and 10MIN in the example shown in FIG. 7.

In the example shown in FIG. 7, the column 10A includes multiple calculation elements 10AC and 10AD in addition to multiple calculation elements 10AA and 10AB. The multiple calculation elements 10AC and 10AD are configured as in the multiple calculation elements 10AA and 10AB and perform multiple calculation as in the multiple calculation elements 10AA and 10AB.

The reference column 10MAX includes reference elements 10MAXA, 10MAXB, 10MAXC, and 10MAXD without including a multiple calculation element. The reference elements 10MAXA, 10MAXB, 10MAXC, and 10MAXD are configured as in the reference element 10AMAX shown in FIG. 1 and used for correcting resistance values of the multiple calculation elements 10AA to 10AD and 10BA to 10BD at the time of an operation of multiply and accumulate calculation device 1 and at the time of back-propagation learning.

The reference column 10MIN includes reference elements 10MINA, 10MINB, 10MINC, and 10MIND without including a multiple calculation element. The reference elements 10MINA, 10MINB, 10MINC, and 10MIND are configured as in the reference element 10AMIN shown in FIG. 1 and used for correcting resistance values of the multiple calculation elements 10AA to 10AD and 10BA to 10BD at the time of the operation of multiply and accumulate calculation device 1 and at the time of the back-propagation learning.

In the example shown in FIG. 7, a read terminal of the multiple calculation element 10AC is connected to a line L31. A write terminal of the multiple calculation element 10AC is connected to a line L32.

A read terminal of the multiple calculation element 10AD is connected to a line L41. A write terminal of the multiple calculation element 10AD is connected to a line L42.

A common terminal of the multiple calculation elements 10AC and 10AD is connected to a line M1.

Read terminals of the reference elements 10MAXA and 10MINA are connected to a line L11. Write terminals of the reference elements 10MAXA and 10MINA are connected to a line L12.

Read terminals of the reference elements 10MAXB and 10MINB are connected to a line L21. Write terminals of the reference elements 10MAXB and 10MINB are connected to a line L22.

Read terminals of the reference elements 10MAXC and 10MINC are connected to the line L31. Write terminals of the reference elements 10MAXC and 10MINC are connected to the line L32.

Read terminals of the reference elements 10MAXD and 10MIND are connected to the line L41. Write terminals of the reference elements 10MAXD and 10MIND are connected to the line L42.

A common terminal of the reference elements 10MAXA, 10MAXB, 10MAXC, and 10MAXD is connected to a line M3. A common terminal of the reference elements 10MINA, 10MINB, 10MINC, and 10MIND is connected to a line M4.

Although the accumulate calculation unit 11 includes the output detectors 11A and 11B in the example shown in FIG. 1, an accumulate calculation unit 11 includes output detectors 11A and 11B and reference output detectors 11MAX and 11MIN in the example shown in FIG. 7. The reference output detector 11MAX is disposed on the line M3. The reference output detector 11MIN is disposed on the line M4.

In the example shown in FIG. 7, when the first input unit 12A inputs a signal to the reference element 10MAXA, the second input unit 12B inputs a signal to the reference element 10MAXB, the third input unit 12C inputs a signal to the reference element 10MAXC, and the fourth input unit 12D inputs a signal to the reference element 10MAXD, the reference output detector 11MAX detects a total value of a forward output from the reference element 10MAXA, a forward output from the reference element 10MAXB, a forward output from the reference element 10MAXC, and a forward output from the reference element 10MAXD.

For example, when the first input unit 12A inputs a signal to the reference element 10MAXA, the second input unit 12B does not input a signal to the reference element 10MAXB, the third input unit 12C does not input a signal to the reference element 10MAXC, and the fourth input unit 12D does not input a signal to the reference element 10MAXD, the reference output detector 11MAX detects the forward output from the reference element 10MAXA.

In the example shown in FIG. 7, when the first input unit 12A turns on a reverse current path, the second input unit 12B turns on the reverse current path, the third input unit 12C turns on the reverse current path, and the fourth input unit 12D turns on the reverse current path, the reference output detector 11MIN detects a total value of a reverse output flowing through the reference element 10MINA, a reverse output flowing through the reference element 10MINB, a reverse output flowing through the reference element 10MINC, and a reverse output flowing through the reference element 10MIND.

For example, when the first input unit 12A turns off the reverse current path, the second input unit 12B turns on the reverse current path, the third input unit 12C turns off the reverse current path, and the fourth input unit 12D turns off the reverse current path, the reference output detector 11MIN detects the reverse output flowing through the reference element 10MINB.

Also, for reading of the reverse current path, the input unit 12 and the accumulate calculation unit 11 may further include a detection circuit for the reverse current path in the input unit 12 and an input unit for the reverse current path in the accumulate calculation unit 11, respectively.

In the multiply and accumulate calculation device 1 of the second embodiment, the process shown in FIG. 6 is executed as in the multiply and accumulate calculation device 1 of the first embodiment.

The multiply and accumulate calculation device 1 of the second embodiment includes an operation mode in which the electric current flows from the input unit 12 to the output detectors 11A and 11B and the reference output detectors 11MAX and 11MIN and a back-propagation mode in which the electric current flows from the output detectors 11A and 11B and the reference output detector 11MAX and 11MIN to the input unit 12.

When the multiply and accumulate calculation device 1 is in the operation mode, the failure detection unit 13 sets a normal range of a total value of forward outputs from the multiple calculation elements 10AA to 10AD detected by the output detectors 11A and a normal range of a total value of forward outputs from the multiple calculation elements 10BA to 10BD detected by the output detector 11B on the basis of the forward output from the reference column 10MAX detected by the reference output detector 11MAX in step S10.

Next, in step S11, the output detector 11A detects the total value of the forward outputs from the multiple calculation elements 10AA to 10AD. Also, the output detector 11B detects the total value of the forward outputs from the multiple calculation elements 10BA to 10BD.

Next, in step S12, the failure detection unit 13 determines the presence or absence of a failure of the plurality of multiple calculation elements 10AA to 10AD and 10BA to 10BD. In detail, the failure detection unit 13 determines whether or not the plurality of multiple calculation elements 10AA to 10AD include a failed multiple calculation element on the basis of the total value of the forward outputs from the multiple calculation elements 10AA to 10AD detected by the output detector 11A and the normal range of the total value of the forward outputs from the multiple calculation elements 10AA to 10AD. When the total value of the forward outputs from the multiple calculation elements 10AA to 10AD detected by the output detector 11A exceeds the normal range of the total value of the forward outputs from the multiple calculation elements 10AA to 10AD, the failure detection unit 13 determines that the plurality of multiple calculation elements 10AA to 10AD include a failed multiple calculation element and ends the routine shown in FIG. 6.

Also, in step S12, the failure detection unit 13 determines whether or not the plurality of multiple calculation elements 10BA to 10BD include a failed multiple calculation element on the basis of the total value of the forward outputs from the multiple calculation elements 10BA to 10BD detected by the output detector 11B and the normal range of the total value of the forward outputs from the multiple calculation elements 10BA to 10BD. When the total value of the forward outputs from the multiple calculation elements 10BA to 10BD detected by the output detector 11B exceeds the normal range of the total value of the forward outputs from the multiple calculation elements 10BA to 10BD, the failure detection unit 13 determines that the plurality of multiple calculation elements 10BA to 10BD include a failed multiple calculation element and ends the routine shown in FIG. 6.

When the failure detection unit 13 determines that the plurality of multiple calculation elements 10AA to 10AD and 10BA to 10BD have not failed in step S12, the process proceeds to step S13.

In step S13, the comparison unit 14 compares the total value of the forward outputs from the multiple calculation elements 10AA to 10AD detected by the output detector 11A with the forward outputs from the reference columns 10MAX and 10MIN detected by the reference output detectors 11MAX and 11MIN.

In step S13, the comparison unit 14 may compare the total value of the forward outputs from the multiple calculation elements 10BA to 10BD detected by the output detector 11B with the forward outputs from the reference columns 10MAX and 10MIN detected by the reference output detectors 11MAX and 11MIN.

Next, in step S14, the correction unit 15 determines whether or not the discrimination function of the neuromorphic device 100 is likely to deteriorate when the forward resistance values of the multiple calculation elements 10AA to 10AD and 10BA to 10BD are not corrected on the basis of a comparison result by the comparison unit 14. When the discrimination function of the neuromorphic device 100 is likely to deteriorate if the forward resistance values of the multiple calculation elements 10AA to 10AD and 10BA to 10BD are not corrected, the correction unit 15 corrects the forward resistance values of the multiple calculation elements 10AA to 10AD and 10BA to 10BD.

In detail, the correction unit 15 calculates an amount of change in the resistance value depending upon the temperature of the multiple calculation elements 10AA to 10AD on the basis of the total value of the forward outputs from the multiple calculation elements 10AA to 10AD detected by the output detector 11A and the forward outputs of the reference columns 10MAX and 10MIN detected by the reference output detectors 11MAX and 11MIN. Also, the correction unit 15 corrects the forward resistance values of the multiple calculation elements 10AA to 10AD on the basis of the amount of change in the resistance value.

Specifically, when the forward resistance values of the multiple calculation elements 10AA to 10AD are smaller than a predetermined forward resistance value (for example, a standard temperature) due to an increase in the temperature, the correction unit 15 performs correction for increasing the forward resistance values of the multiple calculation elements 10AA to 10AD. Also, when the forward resistance values of the multiple calculation elements 10AA to 10AD are larger than the predetermined forward resistance value due to a decrease in the temperature, the correction unit 15 performs correction by decreasing the forward resistances of the multiple calculation elements 10AA to 10AD. Likewise, the correction unit 15 corrects the forward resistance values of the multiple calculation elements 10BA to 10BD.

When the multiply and accumulate calculation device 1 is in the back-propagation mode, the failure detection unit 13 sets the normal range of the total value of the reverse outputs flowing through the multiple calculation elements 10AA to 10AD detected by the output detector 11A and the normal value of the total value of the reverse outputs flowing through the multiple calculation elements 10BA to 10BD detected by the output detector 11B on the basis of the reverse output flowing through the reference column 10MIN detected by the reference output detector 11MIN in step S10.

Next, in step S11, the output detector 11A detects the total value of the reverse outputs flowing through the multiple calculation elements 10AA to 10AD. Also, the output detector 11B detects the total value of the reverse outputs flowing through the multiple calculation elements 10BA to 10BD.

Next, in step S12, the failure detection unit 13 determines the presence or absence of a failure of the plurality of multiple calculation elements 10AA to 10AD and 10BA to 10BD. In detail, the failure detection unit 13 determines whether or not the plurality of multiple calculation elements 10AA to 10AD include a failed multiple calculation element on the basis of the total value of the reverse outputs flowing through the multiple calculation elements 10AA to 10AD detected by the output detector 11A and the normal range of the total value of the reverse outputs flowing through the multiple calculation elements 10AA to 10AD. When the total value of the reverse outputs flowing through the multiple calculation elements 10AA to 10AD detected by the output detector 11A exceeds the normal range of the total value of the reverse outputs flowing through the multiple calculation elements 10AA to 10AD, the failure detection unit 13 determines that the plurality of multiple calculation elements 10AA to 10AD include a failed multiple calculation element and ends the routine shown in FIG. 6.

In step S12, the failure detection unit 13 determines whether or not the plurality of multiple calculation elements 10BA to 10BD include a failed multiple calculation element on the basis of the total value of the reverse outputs flowing through the multiple calculation elements 10BA to 10BD detected by the output detector 11B and the normal range of the total value of the reverse outputs flowing through the multiple calculation elements 10BA to 10BD. When the total value of the reverse outputs flowing through the multiple calculation elements 10BA to 10BD detected by the output detector 11B exceeds the normal range of the total value of the reverse outputs flowing through the multiple calculation elements 10BA to 10BD, the failure detection unit 13 determines that the plurality of multiple calculation elements 10BA to 10BD include a failed multiple calculation element, and ends the routine shown in FIG. 6.

When the failure detection unit 13 determines that the plurality of multiple calculation elements 10AA to 10AD and 10BA to 10BD have not failed in step S12, the process proceeds to step S13.

In step S13, the comparison unit 14 compares the total value of the reverse outputs flowing through the multiple calculation elements 10AA to 10AD detected by the output detector 11A with the reverse output flowing through the reference column 10MIN detected by the reference output detector 11MIN.

In step S13, the comparison unit 14 may compare the total value of the reverse outputs flowing through the multiple calculation elements 10BA to 10BD detected by the output detector 11B with the reverse output flowing through the reference column 10MIN detected by the reference output detector 11MIN.

Next, in step S14, the correction unit 15 determines whether or not the discrimination function of the neuromorphic device 100 is likely to deteriorate (in detail, desired back-propagation learning is unlikely to be executed) when the reverse resistance values of the multiple calculation elements 10AA to 10AD and 10BA to 10BD are not corrected on the basis of a comparison result by the comparison unit 14. When the discrimination function of the neuromorphic device 100 is likely to deteriorate (when desired back-propagation learning is unlikely to be executed) if the reverse resistance values of the multiple calculation elements 10AA to 10AD and 10BA to 10BD are not corrected, the correction unit 15 corrects the reverse resistance values of the multiple calculation elements 10AA to 10AD and 10BA to 10BD.

In detail, the correction unit 15 calculates an amount of change in a resistance value depending upon the temperatures of the multiple calculation elements 10AA to 10AD on the basis of a total value of the reverse outputs flowing through the multiple calculation elements 10AA to 10AD detected by the output detector 11A and the reverse output flowing through the reference column 10MIN detected by the reference output detector 11MIN. Also, the correction unit 15 corrects the reverse resistance values of the multiple calculation elements 10AA to 10AD on the basis of the amount of change in the resistance value.

Specifically, as in the case in which the multiply and accumulate calculation device 1 is in the operation mode, when the reverse resistance values of the multiple calculation elements 10AA to 10AD are smaller than the desired reverse resistance value due to an increase in the temperature, the correction unit 15 performs correction for increasing the reverse resistance values of the multiple calculation elements 10AA to 10AD. Also, when the reverse resistance values of the multiple calculation elements 10AA to 10AD are larger than the desired reverse resistance value due to a decrease in the temperature, the correction unit 15 performs correction for decreasing the reverse resistance values of the multiple calculation elements 10AA to 10AD. Likewise, the correction unit 15 corrects the reverse resistance values of the multiple calculation elements 10BA to 10BD.

As described above, the multiply and accumulate calculation device 1 according to the second embodiment includes the reference column 10MAX including the reference elements 10MAXA to 10MAXD and the reference column 10MIN including the reference elements 10MINA to 10MIND.

Thus, according to the multiply and accumulate calculation device 1 of the second embodiment, it is possible to minimize deterioration in performance of the neural network due to a change in temperature using the reference columns 10MAX and 10MIN when the multiply and accumulate calculation device 1 is applied to the neural network.

Also, in the multiply and accumulate calculation device 1 of the second embodiment, as described above, the reference output detector 11MAX that detects the output from the reference column 10MAX and the reference output detector 11MIN that detects the output from the reference column 10MIN are provided.

Thus, according to the multiply and accumulate calculation device 1 of the second embodiment, it is possible to minimize deterioration in performance of the neural network due to a change in temperature using the reference output detectors 11MAX and 11MIN when the multiply and accumulate calculation device 1 is applied to the neural network.

Also, in the multiply and accumulate calculation device 1 of the second embodiment, as described above, the normal range of the total value of the outputs from the multiple calculation elements 10AA to 10AD detected by the output detector 11A and the normal range of the total value of the outputs from the multiple calculation elements 10BA to 10BD detected by the output detector 11B are set on the basis of an output of each of the reference columns 10MAX and 10MIN detected by the reference output detectors 11MAX and 11MIN. Also, the presence or absence of a failure of the multiple calculation elements 10AA to 10AD is determined on the basis of the total value of the outputs from the multiple calculation elements 10AA to 10AD detected by the output detector 11A and the normal range and the presence or absence of a failure of the multiple calculation elements 10BA to 10BD is determined on the basis of a total value of outputs from the multiple calculation elements 10BA to 10BD detected by the output detector 11B and the normal range.

Thus, according to the multiply and accumulate calculation device 1 of the second embodiment, when the multiply and accumulate calculation device 1 is applied to the neural network, it is possible to minimize the possibility that the performance of the neural network will deteriorate without determining whether or not the multiple calculation elements 10AA to 10AD and 10BA to 10BD have failed.

Also, in the multiply and accumulate calculation device 1 of the second embodiment, as described above, when the multiply and accumulate calculation device 1 is in the operation mode, a total value of the outputs from the multiple calculation elements 10AA to 10AD detected by the output detector 11A is compared with the output from the reference column 10MAX detected by the reference output detector 11MAX. Also, the amount of change in the resistance value depending upon the temperatures of the multiple calculation elements 10AA to 10AD and 10BA to 10BD is calculated on the basis of the total value of the outputs from the multiple calculation elements 10AA to 10AD detected by the output detector 11A and the output from the reference column 10MAX detected by the reference output detector 11MAX and the resistance values of the multiple calculation elements 10AA to 10AD and 10BA to 10BD are corrected.

Thus, according to the multiply and accumulate calculation device 1 of the second embodiment, when the multiply and accumulate calculation device 1 is applied to a neural network, it is possible to minimize deterioration in performance of the neural network due to a change in temperature as compared with a case in which the resistance values of the multiple calculation elements 10AA to 10AD and 10BA to 10BD are not corrected.

Also, in the multiply and accumulate calculation device 1 of the second embodiment, as described above, when the multiply and accumulate calculation device 1 is in the back-propagation mode, a total value of outputs from the multiple calculation elements 10AA to 10AD detected by the output detector 11A is compared with an output from the reference column 10MIN detected by the reference output detector 11MIN. Also, an amount of change in the resistance value depending upon the temperatures of the multiple calculation elements 10AA to 10AD and 10BA to 10BD is calculated on the basis of the total value of the outputs from the multiple calculation elements 10AA to 10AD detected by the output detector 11A and the output from the reference column 10MIN detected by the reference output detector 11MIN and the resistance values of the multiple calculation elements 10AA to 10AD and 10BA to 10BD are corrected.

Thus, according to the multiply and accumulate calculation device 1 of the second embodiment, when the multiply and accumulate calculation device 1 is applied to a neural network, it is possible to minimize the possibility that desired back-propagation learning cannot be performed due to a change in temperature as compared with a case in which the resistance values of the multiple calculation elements 10AA to 10AD and 10BA to 10BD are not corrected.

Also, in the multiply and accumulate calculation device 1 of the second embodiment, as described above, the reference column 10MAX used for correcting the resistance values of the multiple calculation elements 10AA to 10AD and 10BA to 10BD at the time of the operation of the multiply and accumulate calculation device 1 is provided.

Thus, according to the multiply and accumulate calculation device 1 of the second embodiment, it is possible to easily determine the presence or absence of a failure of the multiple calculation elements 10AA to 10AD and 10BA to 10BD at the time of the operation of the multiply and accumulate calculation device 1 as compared with a case in which the reference column 10MAX is not provided.

Also, in the multiply and accumulate calculation device 1 of the second embodiment, as described above, the reference column 10MIN used for correcting the resistance values of the multiple calculation elements 10AA to 10AD and 10BA to 10BD at the time of back-propagation learning of the multiply and accumulate calculation device 1 is provided.

Thus, according to the multiply and accumulate calculation device 1 of the second embodiment, it is possible to easily determine the presence or absence of a failure of the multiple calculation elements 10AA to 10AD and 10BA to 10BD at the time of back-propagation learning of the multiply and accumulate calculation device 1 as compared with a case in which the reference column 10MIN is not provided.

Third Embodiment

Hereinafter, a third embodiment of a multiply and accumulate calculation device of the present invention will be described.

A multiply and accumulate calculation device 1 of the third embodiment is configured as in the multiply and accumulate calculation device 1 of the first embodiment described above, except for differences to be described below. Therefore, according to the multiply and accumulate calculation device 1 of the third embodiment, it is possible to obtain effects similar to those of the multiply and accumulate calculation device 1 of the first embodiment described above, except for differences to be described below.

Figure 8:
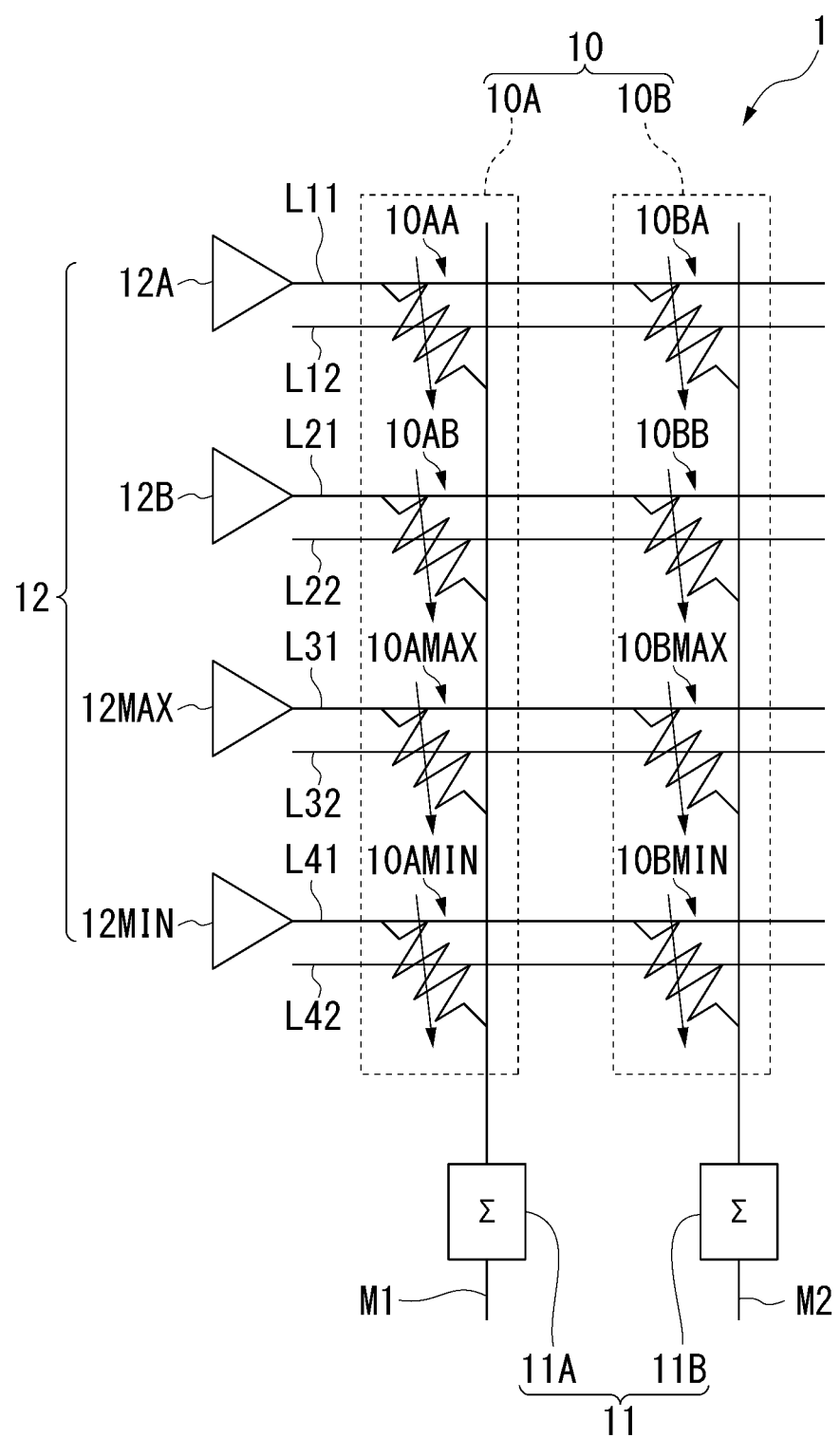
FIG. 8 is a diagram showing an example of a partial configuration of a multiply and accumulate calculation device according to a third embodiment.

FIG. 8 is a diagram showing an example of a partial configuration of the multiply and accumulate calculation device 1 according to the third embodiment.

Although the column 10B includes multiple calculation elements 10BC and 10BD in the example shown in FIG. 1, a column 10B includes reference elements 10BMAX and 10BMIN without including the multiple calculation elements 10BC and 10BD in the example shown in FIG. 8.

In the example shown in FIG. 8, the reference element 10BMAX is configured as in the reference element 10AMAX and can be used to correct resistance values of multiple calculation elements 10AA, 10AB, 10BA, and 10BB at the time of an operation of the multiply and accumulate calculation device 1.

The reference element 10BMIN is configured as in the reference element 10AMIN and can be used to correct the resistance values of the multiple calculation elements 10AA, 10AB, 10BA, and 10BB at the time of back-propagation learning of the multiply and accumulate calculation device 1.

In the example shown in FIG. 8, a read terminal of the reference element 10BMAX is connected to a line L31. A write terminal of the reference element 10BMAX is connected to a line L32.

A read terminal of the reference element 10BMIN is connected to a line L41. A write terminal of the reference element 10BMIN is connected to a line L42.

A common terminal of the reference elements 10BMAX and 10BMIN is connected to a line M2.

In the example shown in FIG. 8, when a first input unit 12A does not input a signal to the multiple calculation element 10BA, a second input unit 12B does not input a signal to the multiple calculation element 10BB, a reference input unit 12MAX inputs a signal to the reference element 10BMAX, and a reference input unit 12MIN does not input a signal to the reference element 10BMIN, an output detector 11B detects a forward output from the reference element 10BMAX.

For example, when the first input unit 12A turns off a reverse current path, the second input unit 12B turns off the reverse current path, the reference input unit 12MAX turns off the reverse current path, and the reference input unit 12MIN turns on the reverse current path, the output detector 11B detects a reverse output that flows through the reference element 10BMIN.

Also, a process may be performed by recording a program for implementing functions of each device (for example, the multiply and accumulate calculation device 1) according to the above-described embodiment on a computer-readable recording medium (a storage medium) and causing a computer system to read and execute the program recorded on the recording medium.

Also, the "computer system" used here may include an operating system (OS) and hardware such as peripheral devices.

Also, the "computer-readable recording medium" refers to a storage device including a rewritable nonvolatile memory such as a flexible disk, a magneto-optical disc, a read only memory (ROM), or a flash memory, a portable medium such as a digital versatile disc (DVD), and a hard disk embedded in the computer system. Also, a recording medium for temporarily storing data may be used as the recording medium.

Furthermore, the "computer-readable recording medium" is assumed to include a medium that holds a program for a constant period of time, such as a volatile memory (for example, a dynamic random access memory (DRAM)) inside a computer system serving as a server or a client when the program is transmitted via a network such as the Internet or a communication circuit such as a telephone circuit.

Also, the above-described program may be transmitted from a computer system storing the program in a storage device or the like to another computer system via a transmission medium or by transmission waves in a transmission medium. Here, the "transmission medium" for transmitting the program refers to a medium having a function of transmitting information, such as a network (communication network) like the Internet or a communication circuit (communication line) like a telephone circuit.

Also, the above-described program may be a program for implementing some of the above-described functions. Further, the above-described program may be a program capable of implementing the above-described function in combination with a program already recorded on the computer system, i.e., a so-called differential file (differential program).

In the computer, for example, a processor such as a central processing unit (CPU) reads and executes a program stored in a memory.

Although embodiments of the present invention have been described in detail with reference to the drawings, the specific configurations are not limited to the embodiments and various modifications and substitutions are made without departing from the scope of the present invention. The configurations described in the above-described embodiments may be combined.

INDUSTRIAL APPLICABILITY

According to the present invention, it is possible to provide a multiply and accumulate calculation device, a neuromorphic device, and a method of using the multiply and accumulate calculation device capable of minimizing deterioration in performance of a neural network due to changes in temperature and element characteristics originating from an electric current direction when the present invention is applied to the neural network.

REFERENCE SIGNS LIST

1 Multiply and accumulate calculation device
2 Multiply and accumulate calculation device
10 Multiple calculation unit
10A Column
10AA Multiple calculation element
10AB Multiple calculation element
10AC Multiple calculation element
10AD Multiple calculation element
10AMAX Reference element
10AMIN Reference element
10B Column
10BA Multiple calculation element
10BB Multiple calculation element
10BC Multiple calculation element
10BD Multiple calculation element
10BMAX Reference element
10BMIN Reference element
10MAX Reference column
10MAXA Reference element
10MAXB Reference element
10MAXC Reference element
10MAXD Reference element
10MIN Reference column
10MINA Reference element
10MINB Reference element
10MINC Reference element
10MIND Reference element
11 Accumulate calculation unit
11A Output detector
11B Output detector
11MAX Reference output detector
11MIN Reference output detector
12. Input unit
12A First input unit
12B Second input unit
12C Third input unit
12D Fourth input unit
12MAX Reference input unit
12MIN Reference input unit
13 Failure detection unit
14 Comparison unit
15 Correction unit
100 Neuromorphic device
101 Input layer
101A, 101B, 101C, 101D Node
102 Hidden layer
102A, 102B, 102C Node
103 Output layer
103A, 103B, 103C Node
A Magnetoresistance effect element
AA Write terminal
AB Common terminal
AC Read terminal
A1 Magnetization free layer
A11 First region
A12 Second region
A2 Magnetization fixed layer
A3 Nonmagnetic layer
DW Magnetic domain wall
L11 line
L12 line
L21 line
L22 line
L31 line
L32 line
L41 line
L42 line
M1 line
M2 line
M3 line
M4 line

The invention claimed is:

1. A multiply and accumulate calculation device comprising:
a multiple calculation unit; and
an accumulate calculation unit,
wherein the multiple calculation unit includes a plurality of multiple calculation elements and at least one reference element,
each of the plurality of multiple calculation elements and the at least one reference element is a variable resistance element,
the accumulate calculation unit includes an output detector configured to detect a total value of at least outputs from the plurality of multiple calculation elements,
each of the plurality of multiple calculation elements is a magnetoresistance effect element including:

a first magnetization free layer having a magnetic domain wall;

a first magnetization fixed layer in which a magnetization direction is fixed; and a first nonmagnetic layer sandwiched between the first magnetization free layer and the first magnetization fixed layer, and the at least one reference element is a reference magnetoresistance effect element including:

a second magnetization free layer that does not have the magnetic domain wall or a third magnetization free layer having the magnetic domain wall;

a second magnetization fixed layer in which the magnetization direction is fixed; and a second nonmagnetic layer sandwiched between the second magnetization free layer or the third magnetization free layer and the second magnetization fixed layer, wherein a relative angle formed by each of one magnetization direction of the second magnetization free layer or a plurality of magnetization directions of the third magnetization free layer and the magnetization direction of the second magnetization fixed layer is fixed.

2. The multiply and accumulate calculation device according to claim 1, wherein the at least one reference element includes:

a first reference element in which the one magnetization direction of the second magnetization free layer and the magnetization direction of the second magnetization fixed layer are antiparallel;

a second reference element with the second magnetization fixed layer in which the one magnetization direction of the second magnetization free layer and the magnetization direction of the second magnetization fixed layer are parallel;

a third reference element having the third magnetization free layer in which a maximum resistance value is set; or a fourth reference element having the third magnetization free layer in which a minimum resistance value is set.

3. The multiply and accumulate calculation device according to claim 1, wherein the at least one reference element includes:

a first reference element in which the one magnetization direction of the second magnetization free layer and the magnetization direction of the second magnetization fixed layer are antiparallel or a third reference element having the third magnetization free layer in which a maximum resistance value is set; and a second reference element with the second magnetization fixed layer in which the one magnetization direction of the second magnetization free layer and the magnetization direction of the second magnetization fixed layer are parallel or a fourth reference element having the third magnetization free layer in which a minimum resistance value is set.

4. The multiply and accumulate calculation device according to claim 2, further comprising a comparison unit configured to compare the outputs from the plurality of multiple calculation elements with an output from the at least one reference element.

5. The multiply and accumulate calculation device according to claim 1, further comprising at least one reference column, wherein the at least one reference column includes the at least one reference element without including the plurality of multiple calculation elements.

6. The multiply and accumulate calculation device according to claim 5, further comprising at least one reference output detector, wherein each of the at least one reference output detector is configured to detect an output of each of the at least one reference column.

7. A method of using the multiply and accumulate calculation device according to claim 6, wherein the multiply and accumulate calculation device further comprises a failure detection unit, and the method comprises:

a normal range setting process in which the failure detection unit is configured to set a normal range of the total value of the outputs from the plurality of multiple calculation elements detected by the output detector on the basis of the output of each of the at least one reference column detected by the at least one reference output detector; and a failure presence or absence determination process in which the failure detection unit is configured to determine the presence or absence of a failure of the plurality of multiple calculation elements on the basis of the total value of the outputs from the plurality of multiple calculation elements detected by the output detector and the normal range.

8. The method of using the multiply and accumulate calculation device according to claim 7, wherein the multiply and accumulate calculation device further comprises a comparison unit, and the method further comprises a comparison process in which the comparison unit is configured to compare the total value of the outputs from the plurality of multiple calculation elements detected by the output detector with the output of each of the at least one reference column detected by the at least one reference output detector.

9. The method of using the multiply and accumulate calculation device according to claim 8, wherein the multiply and accumulate calculation device further comprises a correction unit, and the method further comprises a correction process in which the correction unit is configured to calculate an amount of change in a resistance value depending upon temperatures of the plurality of multiple calculation elements on the basis of the total value of the outputs from the plurality of multiple calculation elements detected by the output detector and the output of each of the at least one reference column detected by the at least one reference output detector and correct resistance values of the plurality of multiple calculation elements.

10. The method of using the multiply and accumulate calculation device according to claim 5, wherein the at least one reference column includes an operation reference column and a back-propagation reference column.

11. A neuromorphic device comprising the multiply and accumulate calculation device according to claim 1.

12. The multiply and accumulate calculation device according to claim 3, further comprising a comparison unit configured to compare the outputs from the plurality of multiple calculation elements with an output from the at least one reference element.

13. The multiply and accumulate calculation device according to claim 2, further comprising at least one reference column,
    wherein the at least one reference column includes the at least one reference element without including the plurality of multiple calculation elements.

14. The multiply and accumulate calculation device according to claim 3, further comprising at least one reference column,
    wherein the at least one reference column includes the at least one reference element without including the plurality of multiple calculation elements.

15. The method of using the multiply and accumulate calculation device according to claim 6, wherein the at least one reference column includes an operation reference column and a back-propagation reference column.

16. A neuromorphic device comprising the multiply and accumulate calculation device according to claim 2.

17. A neuromorphic device comprising the multiply and accumulate calculation device according to claim 3.

18. A neuromorphic device comprising the multiply and accumulate calculation device according to claim 4.

19. A neuromorphic device comprising the multiply and accumulate calculation device according to claim 5.

20. A neuromorphic device comprising the multiply and accumulate calculation device according to claim 10.

\* \* \* \* \*